(12) United States Patent
Suzumura et al.

(10) Patent No.: US 8,357,940 B2
(45) Date of Patent: Jan. 22, 2013

(54) THIN FILM TRANSISTOR AND MANUFACTURING METHOD THEREOF

(75) Inventors: Isao Suzumura, Tokyo (JP); Yoshiaki Toyota, Koshigaya (JP); Mieko Matsumura, Kokubunji (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 295 days.

(21) Appl. No.: 12/958,605

(22) Filed: Dec. 2, 2010

(65) Prior Publication Data

US 2011/0133197 A1 Jun. 9, 2011

(30) Foreign Application Priority Data

Dec. 3, 2009 (JP) ................................. 2009-275492

(51) Int. Cl.
*H01L 29/04* (2006.01)

(52) U.S. Cl. .................... 257/64; 257/65; 257/E31.043; 438/488

(58) Field of Classification Search .................... 257/59, 257/64–67, 72; 427/576
See application file for complete search history.

(56) References Cited

U.S. PATENT DOCUMENTS

| 7,402,506 B2* | 7/2008 | Levy et al. ..................... 438/584 |
| 8,030,655 B2* | 10/2011 | Yamazaki ....................... 257/67 |
| 8,237,167 B2* | 8/2012 | Yamazaki ....................... 257/59 |
| 2008/0258140 A1* | 10/2008 | Lee et al. ......................... 257/43 |
| 2009/0321737 A1* | 12/2009 | Isa et al. .......................... 257/57 |

FOREIGN PATENT DOCUMENTS

| JP | 2007-165921 | 6/2007 |
| JP | 2009-088106 | 4/2009 |
| JP | 2009-111302 | 5/2009 |

OTHER PUBLICATIONS

Yoshiaki Toyota et al., High On/Off-Current Ratio in Bottom-Gated Microcrystalline-Silicon Thin-Film Transistors With Vertical-Offset Structure, IEEE Electron Device Letters, 2010.

* cited by examiner

*Primary Examiner* — Jenny L Wagner
*Assistant Examiner* — Mark Tornow
(74) *Attorney, Agent, or Firm* — Antonelli, Terry, Stout & Kraus, LLP.

(57) ABSTRACT

A bottom gate-type thin film transistor includes a gate insulating film, an interlayer insulating film formed on the gate insulating film, having an opening which is formed in a formation region of a gate electrode, and a semiconductor film formed on the interlayer insulating film so as to cover the opening. The interlayer insulating film contains nitrides in an amount larger than that in the gate insulating film, and the semiconductor film includes a microcrystalline semiconductor film or a polycrystalline semiconductor film formed on semiconductor crystalline nuclei which are formed on the gate insulating film and the interlayer insulating film and contain at least Ge.

7 Claims, 17 Drawing Sheets

THIN FILM TRANSISTOR AND MANUFACTURING METHOD THEREOF

CROSS-REFERENCE TO RELATED APPLICATION

The present application claims priority from Japanese patent application JP2009-275492 filed on Dec. 3, 2009, the content of which is hereby incorporated by reference into this application.

BACKGROUND OF THE INVENTION

1. Field of the Invention

The present invention relates to a thin film transistor and a manufacturing method thereof, and more specifically, to a thin film transistor which is formed, for example, on a substrate of a display device and the like, and a manufacturing method thereof.

2. Description of the Related Art

In recent years, with the expansion of the market for cellular phones or digital single-lens reflex cameras, there has been a vigorous development in high-definition liquid crystal displays (liquid crystal display devices) or organic EL displays (organic EL display devices), and the like. A big problem in the development of these displays lies in the difficulty of achieving both high performance and low cost in thin film transistors for driving a so-called backplane.

However, although conventional amorphous silicon (a-Si) thin film transistors can be formed at low cost, they have a problem in that the field-effect mobility thereof is as low as about 0.5 $cm^2/Vs$ and the threshold voltage thereof is shifted by an amount of 1 V or more within 100 hours. Moreover, although conventional low-temperature polycrystalline silicon (LTPS) thin film transistors have high performance, they have a problem in that the manufacturing method thereof involves laser annealing which increases the number of manufacturing processes and thus cost-reduction is difficult. For these reasons, in recent years, lots of attention is given to so-called microcrystalline silicon thin film transistors in which a higher field-effect mobility and a lower threshold voltage shift than the a-Si thin film transistors can be expected and which can be manufactured at lower cost than the LTPS thin film transistors.

As a method of forming the microcrystalline silicon, for example, a method that uses a thermal annealing technique, a laser annealing technique, and a plasma enhanced chemical vapor deposition (CVD) method is known. However, the annealing technique has a problem in that it involves a number of manufacturing processes similarly to LTPS thin film transistors. Moreover, the plasma enhanced CVD method has a problem in that since an incubation layer formed in the initial stage of deposition has poor crystallinity, it is difficult to achieve an improvement in field-effect mobility and a reduction of the threshold voltage shift in thin film transistors using microcrystalline silicon formed by the plasma enhanced CVD method. As a substitute for these methods, a reactive thermal chemical vapor deposition (CVD) method which can form crystalline nuclei directly on an insulating film at a temperature of about 500° C. by using a redox reaction of source gases is anticipated to be an effective microcrystalline silicon deposition technique. When this technique is put into practical use, since it is compatible with the a-Si process, it may be possible to form thin film transistors with few manufacturing processes. Further, through the use of high-quality microcrystalline silicon, it may be possible to achieve an improvement in field-effect mobility and a reduction of the threshold voltage shift in the thin film transistors.

JP 2007-165921 A is an example of the related art of the present invention. According to the invention disclosed in JP 2007-165921 A, after crystalline nuclei are formed on a substrate by a thermal chemical vapor deposition (CVD) method, crystals are grown using the crystalline nuclei with a low-temperature crystal growth technique. In this way, a polycrystalline film which has high crystallinity and of which the crystal grain size and the crystal orientation are controlled appropriately can be formed with ease at a low temperature.

SUMMARY OF THE INVENTION

For example, application of polycrystalline silicon thin film transistors to a general bottom gate structure (the same can be applied to microcrystalline silicon thin film transistors), may cause a problem in that an off-current is likely to increase since the crystallinity of a channel layer is superior to that of the application of amorphous silicon thin film transistors. To solve this problem, it is necessary to weaken a strong electric field applied to a drain end of the channel layer. For this, it may be effective to provide an offset region in a vertical direction of a thin film transistor (with respect to the substrate plane) in order to separate the gate electrode and the source and drain electrodes from each other and suppress an increase in a parasitic capacitance caused thereby. Moreover, in polycrystalline silicon thin film transistors, an off-leak current is likely to be generated by light irradiation similarly to the amorphous silicon thin film transistors. As a countermeasure to this, it is important to shield the polycrystalline silicon.

Based on such a situation, the present inventors propose a thin film transistor having a structure as shown in FIG. 26. The thin film transistor shown in FIG. 26 has a so-called bottom gate structure in which a gate electrode 2 is disposed under a semiconductor film 5. In this case, an interlayer insulating film 4 is formed on a gate insulating film 3 with an opening OP formed in the formation region of the gate electrode 2, and the semiconductor film 5 is formed on the interlayer insulating film 4 so as to cover the opening OP. Therefore, the semiconductor film 5 has a curved shape that reflects the shape of the opening OP of the interlayer insulating film 4. Thus, the sidewall portion of the recess portion of the semiconductor film 5 formed in this way can be configured as an offset region 100. The thin film transistor shown in FIG. 26 is depicted so as to correspond to the configuration of a thin film transistor shown in FIG. 1A according to an embodiment of the present invention, and regarding other configurations than the above, reference should be made to the description of the configuration shown in FIG. 1A.

However, in the thin film transistor having the above configuration, the thickness of the semiconductor film 5 having the curved recess portion is thinner on the sidewall surface layer thereof than on the bottom surface layer thereof. The reason for this is because polycrystalline silicon (the same can be applied to microcrystalline silicon) is used as the semiconductor film. The polycrystalline silicon film is generally formed by depositing an amorphous semiconductor film made from amorphous silicon by a CVD method and crystallizing the amorphous semiconductor film through laser annealing or thermal annealing. In this case, the thickness of the amorphous silicon film deposited by a thermal CVD method or a plasma CVD method is uniform regardless of the kind of underlying insulating film. For this reason, the thickness of a polycrystalline silicon film obtained after the amorphous silicon is crystallized by laser annealing is uniform on the bottom surface and the sidewall surface of an opening. However, since the source and drain electrodes are formed thereafter, when a metal film formed on the semiconductor film is removed by a selective etching method which uses photolithography, it is difficult with a general dry-etching method to remove only the film which should be etched. Moreover, the top side of a film underlying the metal film is also likely to be removed partially, and the etching rate of the opening is likely to be faster on the tapered sidewall surface than on the bottom surface thereof.

During the crystallization of the amorphous silicon, the amorphous silicon may melt under certain laser annealing conditions, and the thickness of the polycrystalline silicon film may be thinner on the sidewall surface of the opening than on the bottom surface of the opening. In this case, the thickness of the polycrystalline silicon film is likely to be further decreased on the sidewall surface of the opening after selective etching for forming the source and drain electrodes is performed.

As described above, in the thin film transistor having the above configuration, when the thickness of the semiconductor film 5 having the curved recess portion is thinner on the sidewall surface layer thereof than on the bottom surface layer thereof, there is a problem in that the channel resistance increases, and there is a limitation in the improvement of field-effect mobility, for example.

An object of the present invention is to provide a thin film transistor in which an increase in the channel resistance is obviated.

Another object of the present invention is to provide a method of manufacturing a thin film transistor capable of increasing the thickness of a semiconductor film on a desired portion.

The present invention can be configured as follows, for example.

(1) According to the present invention, there is provided a thin film transistor including:
  an insulation substrate;
  a gate electrode formed on an upper surface of the insulation substrate;
  a gate insulating film formed on the upper surface of the insulation substrate and an upper surface of the gate electrode;
  an interlayer insulating film formed on an upper surface of the gate insulating film, having an opening which is formed in a formation region of the gate electrode in top view;
  a semiconductor film formed on the interlayer insulating film around the opening so as to cover the opening; and
  a drain electrode and a source electrode formed on the semiconductor film so as to face each other with the opening disposed therebetween,
  wherein the interlayer insulating film contains nitrides in an amount larger than that in the gate insulating film, and
  wherein the semiconductor film includes a microcrystalline semiconductor film or a polycrystalline semiconductor film formed on semiconductor crystalline nuclei which are formed on the gate insulating film and the interlayer insulating film and contain at least germanium (Ge).

(2) According to the present invention, there is provided a method of manufacturing a thin film transistor, including the steps of:
  forming a first insulating film and a second insulating film in different regions, the second insulating film containing nitrides in an amount larger than that in the first insulating film;
  forming semiconductor crystalline nuclei containing at least Ge on the surface of each of the first and second insulating films; and
  forming a microcrystalline semiconductor film or a polycrystalline semiconductor film on the surface of each of the first and second insulating films on which the semiconductor crystalline nuclei are formed.

The configurations described above are merely exemplary, and the present invention can be appropriately modified within a range without departing from the technical idea thereof. Moreover, other configuration examples of the present invention than the above-described configuration will become apparent from the description of the entire specification or the accompanying drawings.

With the thin film transistor having the above-described configuration, it is possible to obviate an increase in the channel resistance.

With the method of manufacturing a thin film transistor having the above-described configuration, it is possible to increase the thickness of a semiconductor film on a desired portion.

Other advantages of the present invention will become apparent from the description of the entire specification.

DETAILED DESCRIPTION OF THE INVENTION

Figure 1A:
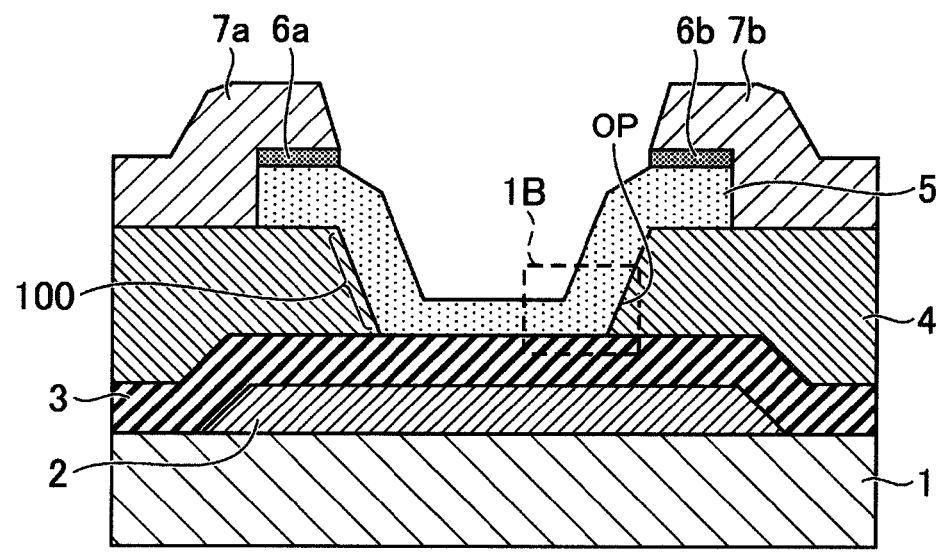
FIG. 1A is a sectional view showing one embodiment of a thin film transistor of the present invention.

Embodiments of the present invention will be described with reference to the accompanying drawings. In the drawings and embodiments, the same or similar constituent elements will be denoted by the same reference numerals and redundant description will be omitted.

Embodiment 1

[Configuration]

FIG. 1A is a sectional view showing Embodiment 1 of a thin film transistor according to the present invention. Referring to FIG. 1A, an insulation substrate 1 is shown, and a patterned gate electrode 2 is formed on the surface of the insulation substrate 1. A gate insulating film 3 is formed on the surface of the insulation substrate 1 so as to cover the gate electrode 2. The gate insulating film 3 is formed, for example, of a silicon oxide (SiO) film. Further, an interlayer insulating film 4 is formed on the gate insulating film 3. The interlayer insulating film 4 is formed, for example, of a silicon nitride (SiN) film. An opening OP is formed in a region of the interlayer insulating film 4 overlapping the gate electrode 2. The sidewall surface of the opening OP is formed in a tapered form so that the area of the opening OP decreases towards the side of the gate insulating film 3. An island-shaped semiconductor film 5 made from microcrytsalline silicon (or polycrystalline silicon) is formed on the opening OP of the interlayer insulating film 4, and the circumference of the semiconductor film 5 is formed on the interlayer insulating film 4 around the opening OP. Thus, the semiconductor film 5 is formed in a curved shape which is not flat so that it has a recess portion that reflects the shape of the opening OP of the interlayer insulating film 4. Moreover, the semiconductor film 5 is formed so that a portion formed on the tapered portion of the opening OP of the interlayer insulating film 4 serves as an offset region 100. A drain electrode 7a and a source electrode 7b which are disposed so as to face each other with the opening OP of the interlayer insulating film 4 disposed between them are formed so as to overlap the semiconductor film 5. The drain electrode 7a is formed so as to extend over the interlayer insulating film 4 which overlaps the semiconductor film 5 with a contact layer 6a disposed therebetween. Similarly, the source electrode 7b is formed so as to extend over the interlayer insulating film 4 which overlaps the semiconductor film 5 with a contact layer 6b disposed therebetween. The contact layers 6a and 6b are formed by doping high-concentration n-type impurities, for example, onto the surface of the semiconductor film 5. Although the notations of the drain and source electrodes of a thin film transistor TFT are interchangeable in accordance with a bias application state, in this specification, the electrode on the left of the drawing will be referred to as the drain electrode 7a and the electrode on the right of the drawing will be referred to as the source electrode 7b for the sake of illustration.

Figure 1B:
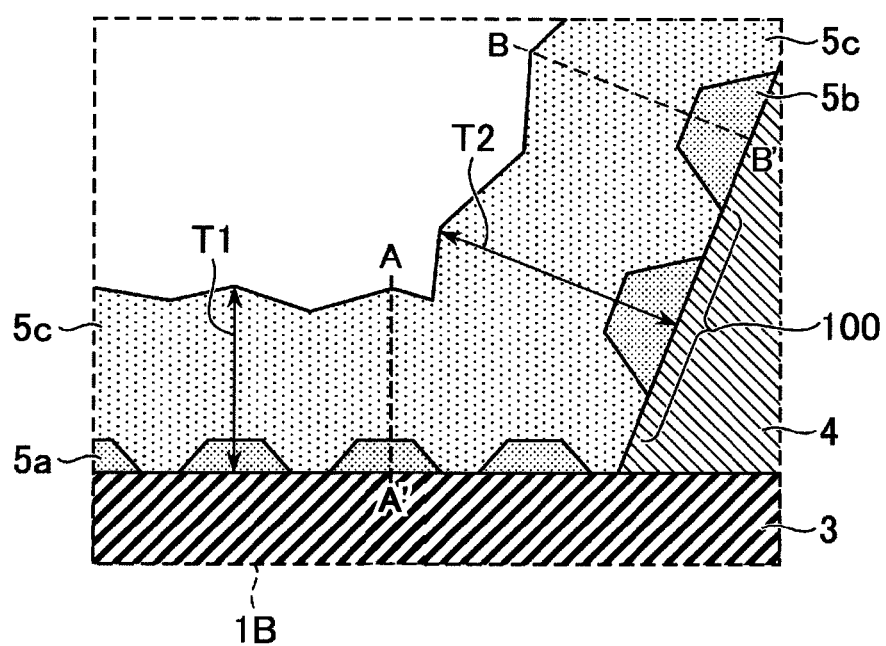
FIG. 1B is a partially enlarged view of a part 1B surrounded by a broken line in FIG. 1A.

FIG. 1B is a partially enlarged view of a part 1B surrounded by a broken line in FIG. 1A, of the thin film transistor TFT having such a configuration. As shown in FIG. 1B, semiconductor crystalline nuclei 5a are formed on the gate insulating film 3, and a semiconductor film 5c is formed so as to cover the semiconductor crystalline nuclei 5a. Moreover, semiconductor crystalline nuclei 5b are formed on the interlayer insulating film 4, and the semiconductor film 5c is formed so as to cover the semiconductor crystalline nuclei 5b. These semiconductor crystalline nuclei 5a and 5b are formed, for example, from SiGe crystalline nuclei or Ge crystalline nuclei. Moreover, the semiconductor film 5c is formed from microcrystalline silicon or polycrystalline silicon. In this case, the semiconductor crystalline nuclei 5a formed on the gate insulating film 3 are formed with a small nucleus size (as compared to the semiconductor crystalline nuclei 5b), and the semiconductor crystalline nuclei 5b formed on the interlayer insulating film 4 are formed with a large nucleus size (as compared to the semiconductor crystalline nuclei 5a). Therefore, the semiconductor film 5c formed on the gate insulating film 3 has a small thickness T1, and the semiconductor film 5c formed on the interlayer insulating film 4 has a large thickness T2.

[Manufacturing Method]

FIGS. 2 to 9 are diagrams showing the processes of a method of manufacturing the thin film transistor of the present invention, showing the same cross-section as FIG. 1A. Hereinafter, the manufacturing method will be described in the order of the processes.

Figure 2:
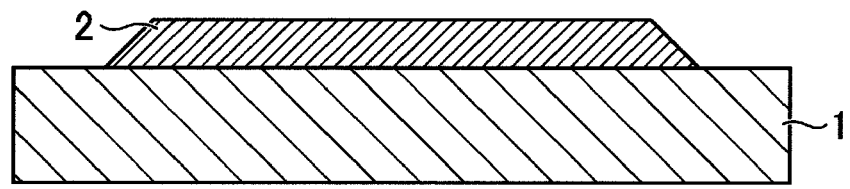
FIG. 2 is a view showing one embodiment of a method of manufacturing the thin film transistor shown in FIG. 1A, showing a series of manufacturing processes together with FIGS. 3 to 9.

Process 1 (FIG. 2)

First, the insulation substrate 1 is prepared, and the gate electrode 2 is formed on the surface of the insulation substrate 1. As for the material of the gate electrode 2, for example, metals such as Nb, Mo, W, Ta, Cr, Ti, Fe, Ni, or Co, alloys thereof, and lamination films thereof can be used. Moreover, in the present invention, since the upper-limit temperature of the manufacturing of the thin film transistor can decrease in the entire process, low-resistance metals such as Al or Cu can be used. Deposition is carried out by a sputtering method, for example. The film thickness is set to, for example, approximately 100 nm so that resistance of metal line does not increase. Patterning is carried out using a well-known photolithography technique.

Figure 3:
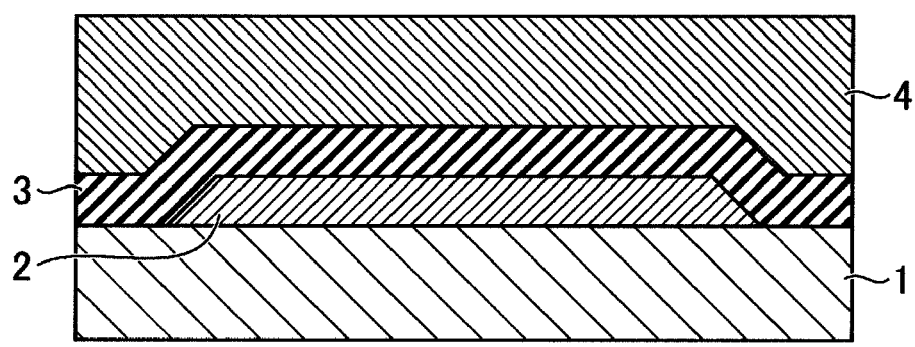
FIG. 3 is a view showing one embodiment of a method of manufacturing the thin film transistor shown in FIG. 1A, showing a series of manufacturing processes together with FIG. 2 and FIGS. 4 to 9.

Process 2 (FIG. 3)

The gate insulating film 3 and the interlayer insulating film 4 are sequentially formed on the surface of the insulation substrate 1 so as to cover the gate electrode 2. The gate insulating film 3 is formed, for example, of a silicon oxide (SiO) film, and the interlayer insulating film 4 is formed, for example, of a silicon nitride (SiN) film. However, a SiON film, for example, may be used as the gate insulating film 3. In this case, the interlayer insulating film 4 may have a configuration in which the amount of nitride contained therein is larger than that in the gate insulating film 3. Deposition of these films is preferably carried out continuously, for example, by a plasma CVD method for reduction of takt time. However, other methods such as a sputtering method, plasma oxidation, or optical oxidation may be used. The thickness of the gate insulating film 3 is preferably set to be equal to or larger than that of the gate electrode 2 in order to increase dielectric strength voltage of the thin film transistor and prevent disconnection of the gate insulating film 3 on the gate electrode 2 and is set to 50 nm to 300 nm, for example. The thickness of the interlayer insulating film 4 is preferably set to about 500 nm in order to provide an offset region (denoted by reference numeral 100 in FIG. 1A) in the vertical direction of a semiconductor film 5 of the thin film transistor and decrease a parasitic capacitance between the gate electrode 3 and the drain electrode 7a and between the gate electrode 3 and the source electrode 7b.

Figure 4:
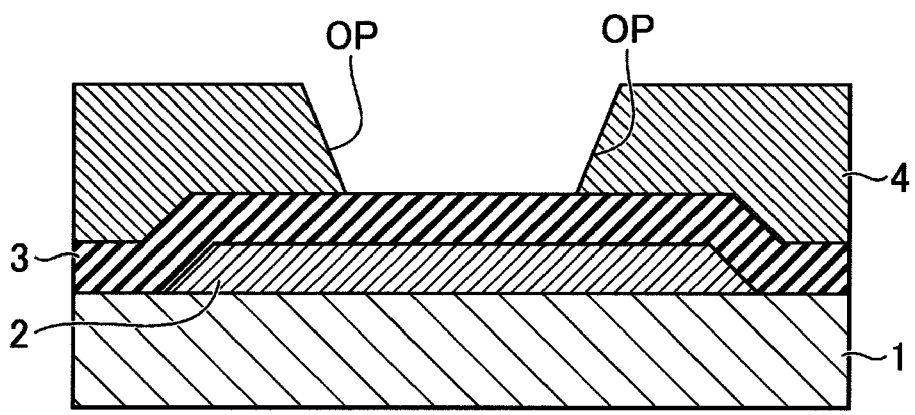
FIG. 4 is a view showing one embodiment of a method of manufacturing the thin film transistor shown in FIG. 1A, showing a series of manufacturing processes together with FIGS. 2 and 3 and FIGS. 5 to 9.

Process 3 (FIG. 4)

The opening OP is formed in a region of the interlayer insulating film 4 overlapping the gate electrode 2. The opening OP is formed by wet-etching which uses a photolithography technique. Moreover, by the wet-etching, a tapered portion is formed on the sidewall surface of the opening OP. The tapered portion has a slope such that the area of the opening OP decreases towards the side of the gate insulating film 3. Moreover, during wet-etching, it is desirable that as much as possible of the gate insulating film 3 is not removed by using a property such that the etching rates of the gate insulating film 3 and the interlayer insulating film 4 are different.

Figure 5:
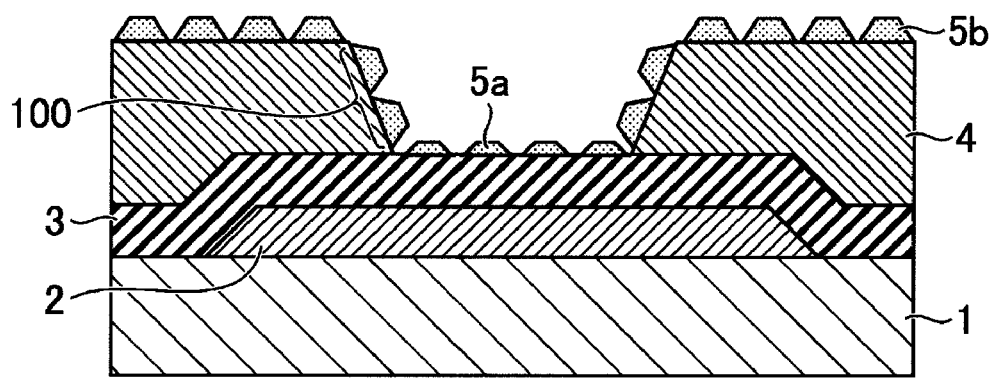
FIG. 5 is a view showing one embodiment of a method of manufacturing the thin film transistor shown in FIG. 1A, showing a series of manufacturing processes together with FIGS. 2 to 4 and FIGS. 6 to 9.

Process 4 (FIG. 5)

The semiconductor crystalline nuclei 5b and 5a are formed on the surface of the interlayer insulating film 4 and the surface of the gate insulating film 3 exposed from the opening OP of the interlayer insulating film 4, respectively. Here, the semiconductor crystalline nuclei 5b on the interlayer insulating film 4 are formed so as to have a larger nucleus size than the semiconductor crystalline nuclei 5a on the gate insulating film 3.

The semiconductor crystalline nuclei 5a and 5b are formed, for example, from SiGe crystalline nuclei or Ge crystalline nuclei. The semiconductor crystalline nuclei 5a and 5b may contain at least Ge. For example, SiGe crystalline nuclei can be formed by a general low pressure chemical vapor deposition (CVD) method which uses reactive thermal decomposition of semiconductor gas (for example, silane ($SiH_4$), disilane ($Si_2H_6$), and germane ($GeH_4$)). Moreover, as another method, when it is necessary to decrease the process temperature on a glass substrate or the like, a reactive thermal CVD method which uses a redox reaction of hydrogenated semiconductor gas and halogenated gas can be used. In the reactive thermal CVD method, $Si_nH_{2n+2}$ (n>1) or dilution gases thereof diluted with $H_2$, He, $N_2$, Ar, and the like can be used as the hydrogenated semiconductor gas. For example, $SiH_4$ which is often industrially used is preferably used for reduction of gas cost. However, since it is necessary to suppress a gas-phase reaction of source gases for improvement of crystallinity of a film formed by the reactive thermal CVD method, it is preferable to use high-order $Si_2H_6$ having high reactivity, for example, in order to realize deposition at a low temperature. For example, germanium tetrafluoride ($GeF_4$) or dilution gases thereof diluted with He, $N_2$, Ar, or the like may be used, as for the halogenated gas. Moreover, a combination of silanes, $GeH_4$, and $F_2$, a combination of $GeH_4$ and silicon tetrafluoride ($SiF_4$), and the like can be used, for example. Further, in the reactive thermal CVD method, in addition to the above-mentioned hydrogenated semiconductor gas and halogenated gas, carrier gases such as He, $N_2$, or Ar, for example, may be supplied. For example, when $Si_2H_6$ and $GeF_4$ are used, the ratio of $Si_2H_6$ flow rate to $GeF_4$ flow rate is 1:0.005 to 2, for example. When He gas is supplied as carrier gas, for example, the ratio of $Si_2H_6$ flow rate to He flow rate can be set to 1:10 to 5000. Deposition pressure is preferably limited more than the conditions which are generally used in the reactive thermal CVD method. In the reactive thermal CVD method, about 10 Pa to 10000 Pa can be used as the deposition pressure. However, in the case of the present invention, it is desirable to form crystalline nuclei having a size of about 10 nm to 100 nm on the gate insulating film 3 and the interlayer insulating film 4, and it is necessary to prevent formation of an incubation layer having poor crystallinity and island-shaped crystals having a size of 100 nm or larger (crystals having a size of 100 nm or smaller are often referred to as crystalline nuclei, and crystals having a size of 100 nm or larger are often referred to as islands). Further, it is necessary to shorten the deposition start time on the interlayer insulating film 4 more than on the gate insulating film 3. Therefore, in the present invention, the deposition pressure is preferably maintained to be as low as possible to an extent that a practical deposition rate can be secured. Therefore, the deposition pressure is preferably set to 10 Pa to 1330 Pa, for example.

The deposition temperature is preferably set to 300° C. or higher where nucleus formation occurs and 650° C. or lower for preventing degradation of film crystallinity by a gas-phase reaction. However, in the reactive thermal CVD method, at low temperatures where silicon deposition species are rarely generated, islands having a large size are likely to be formed due to generation of germanium deposition species and the etching effect of F. At high temperatures, an incubation layer having poor crystallinity is likely to be formed on an insulating film. Therefore, in the present invention where formation of crystalline nuclei is necessary, a deposition temperature of 400° C. or higher and 600° C. or lower is further preferable.

The deposition conditions include, for example, $Si_2H_6$ flow rate: 4 sccm, 10%-$GeF_4$/He flow rate: 0.4 sccm, He flow rate: 1000 sccm, substrate temperature: 500° C., and total pressure: 133 Pa (which will be referred to as deposition condition example 1). However, these conditions are exemplary, and the deposition conditions can be appropriately changed.

As for the size of the semiconductor crystalline nuclei 5a and 5b which are made from SiGe and formed on the gate insulating film 3 or the interlayer insulating film 4, the lower limit is preferably set to 10 nm in order to realize good crystallinity of the semiconductor film 5c which is deposited in a subsequent process, and the upper limit is preferably set to 100 nm or smaller in order to suppress the film from being grown in an island shape.

Moreover, since SiGe is miscible in the entire composition in the solid-phase, in the reactive thermal CVD method, the Ge composition of the SiGe crystalline nuclei can be set to any value between 0 and 100%. However, in the present invention, as described above, since it is necessary to form crystalline nuclei having a size of about 10 nm to 100 nm on the gate insulating film 3 and the interlayer insulating film 4 and shorten the deposition start time on the interlayer insulating film 4 more than on the gate insulating film 3, the Ge composition is preferably set to about 5% to 50%.

Figure 10:
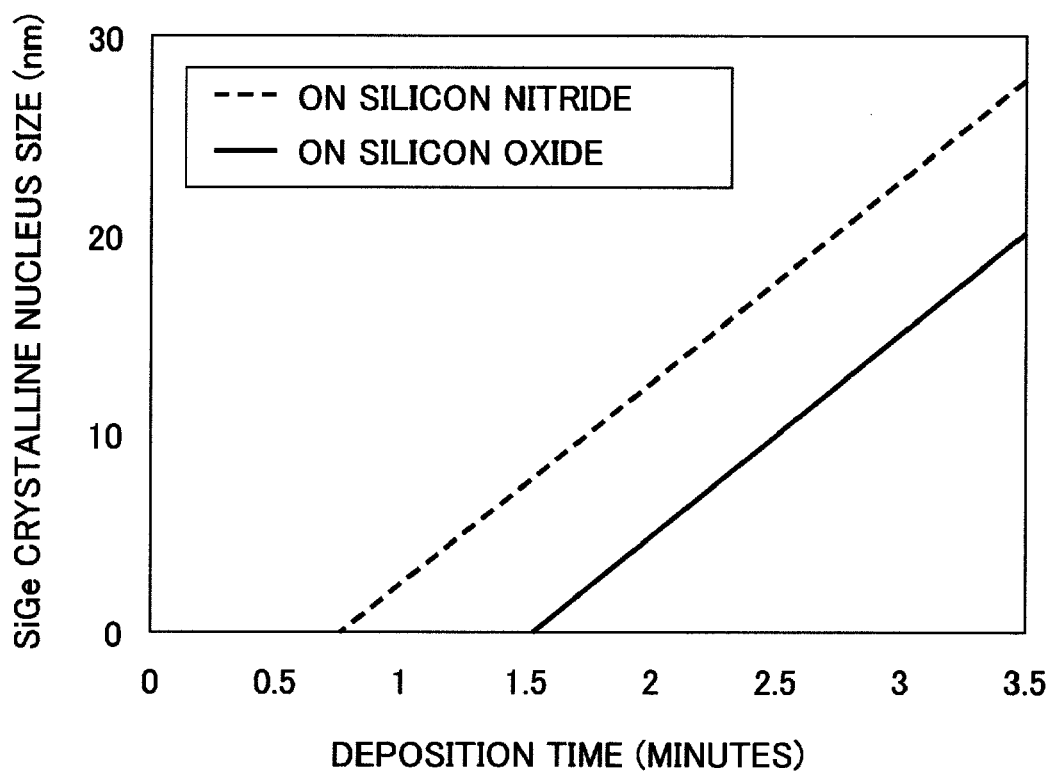
FIG. 10 is a graph showing the size of SiGe crystalline nuclei and a different starting time of the deposition of a semiconductor film on silicon nitride and silicon oxide.

FIG. 10 is a graph showing deposition time dependence of the size of the SiGe crystalline nuclei on a silicon nitride film and a silicon oxide film. In the same graph, the horizontal axis represents deposition time (minutes) and the vertical axis represents the size (nm) of SiGe crystalline nuclei. A deposition time of 0 minutes refers to the time when the supply of deposition source gases onto a substrate is started. In the formation of SiGe crystalline nuclei, the above-mentioned deposition condition example 1 may be used. The SiGe crystalline nuclei start to be formed on the silicon nitride film at a deposition time of 0.5 minutes, and after that, the size thereof increases in proportion to the deposition time. On the other hand, the SiGe crystalline nuclei start to be formed on the silicon oxide film at a deposition time of 1.5 minutes, and after that, the size of crystalline nuclei increases with the deposition time. Therefore, it can be understood that when an underlying substrate that forms SiGe crystalline nuclei is an insulating film, depending on the deposition conditions, the formation of nuclei is not started simultaneously with the start of the supply of source gases, but the growth of nuclei is started after a passage of a deposition start time (in the deposition field, this time is referred to as an incubation time). Moreover, it can be understood that the deposition start time for the silicon nitride film is shorter than for the silicon oxide film. It is considered that such a property of nucleus formation reflects the influence of the kind of an underlying insulating film on a nucleation process where deposition species generated from source gases are nucleated.

Figure 6:
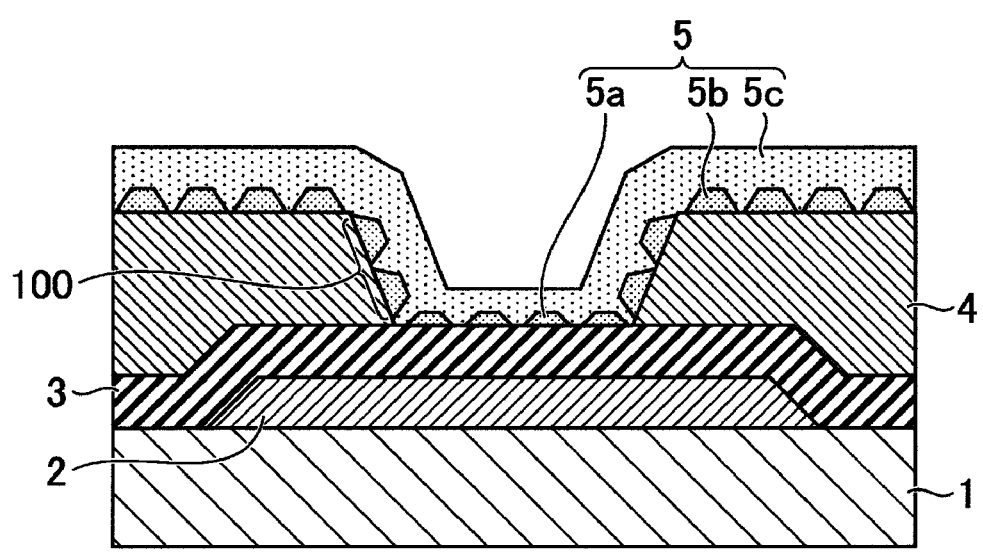
FIG. 6 is a view showing one embodiment of a method of manufacturing the thin film transistor shown in FIG. 1A, showing a series of manufacturing processes together with FIGS. 2 to 5 and FIGS. 7 to 9.

Process 5 (FIG. 6)

Subsequently, the microcrystalline semiconductor film 5c is formed. The semiconductor film 5c is formed by carrying out crystal growth using the semiconductor crystalline nuclei 5a and 5b as seeds. Here, the microcrystalline semiconductor film 5c is a semiconductor film made from very small crystal grains having a grain size of 1 to 100 nm.

As for the material of the semiconductor film 5c, SiGe is preferably used, for example. This is because the use of SiGe enables selective crystal growth on the semiconductor crystalline nuclei 5a without being deposited on the underlying insulating film. However, the Ge composition may be at least the same as the value in the semiconductor crystalline nuclei 5a, or is preferably set to a value as low as possible. This is because if the Ge composition is high, the film is likely to be grown in an island shape, and the roughness of the semiconductor film 5c being formed may increase. Another reason is based on the fact that a thin film transistor in which a SiGe layer having a high Ge composition is used as a channel layer thereof is likely to exhibit p-type characteristics and is disadvantageous in forming an n-type thin film transistor. In this respect, silicon is preferred as the material of the semiconductor film 5c and can be used in the present invention. However, with the silicon, since selective growth on the semiconductor crystalline nuclei 5a and 5b and the underlying insulating film does not take place, in order to grow microcrystalline films, it is necessary to take measures such as increasing the formation density of the semiconductor crystalline nuclei 5a and 5b. For this reason, the Ge composition in the semiconductor film 5c is preferably in the range of 0 to 50%.

Although the deposition conditions of the semiconductor film 5c may be exactly the same as the case of the semiconductor crystalline nuclei 5a and 5b, in order to grow a SiGe film having smaller Ge composition, the deposition conditions may include, for example, $Si_2H_6$ flow rate: 4 sccm, 10%-$GeF_4$/He flow rate: 0.2 sccm, He flow rate: 1000 sccm, substrate temperature: 500° C., and total pressure: 133 Pa. However, these conditions are exemplary, and the deposition conditions can be appropriately changed. The thickness of the semiconductor film 5 including the thickness of the semiconductor crystalline nuclei 5a and 5b is preferably adjusted so as to be 30 nm or larger. This is to prevent the semiconductor film 5 from becoming too thin to maintain the characteristics of a thin film transistor which may be changed through dry-etching which is performed when forming the drain electrode 7a and source electrode 7b of the thin film transistor in a later process. Moreover, the thickness of the semiconductor film 5c is preferably set to 300 nm or smaller in order to prevent an increase of takt time accompanied by an increase of the deposition time or a formation of a back channel on the surface side of the thin film transistor.

Although the semiconductor film 5c is formed from microcrystalline semiconductor in the above description, polycrystalline semiconductor may be used instead of this. Here, a polycrystalline film is a semiconductor film which is formed from polycrystalline grains having a grain size of 100 nm or larger. As for the material of a polycrystalline semiconductor film, SiGe or Ge can be used similarly to the microcrystalline semiconductor film. However, since the polycrystalline film is likely to have roughness which is higher than the microcrystalline film, in order to suppress the roughness, the Ge composition is preferably set to 0 to 30%, for example. An example of the deposition conditions include $Si_2H_6$ flow rate: 4 sccm, 10%-$GeF_4$/He flow rate: 0.4 sccm, He flow rate: 1000 sccm, substrate temperature: 520° C., and total pressure: 67 Pa. The thickness of the semiconductor film 5 that is the polycrystalline semiconductor film may be set to 30 nm to 300 nm similarly to the case when the semiconductor film 5 is the microcrystalline semiconductor film.

Figure 11:
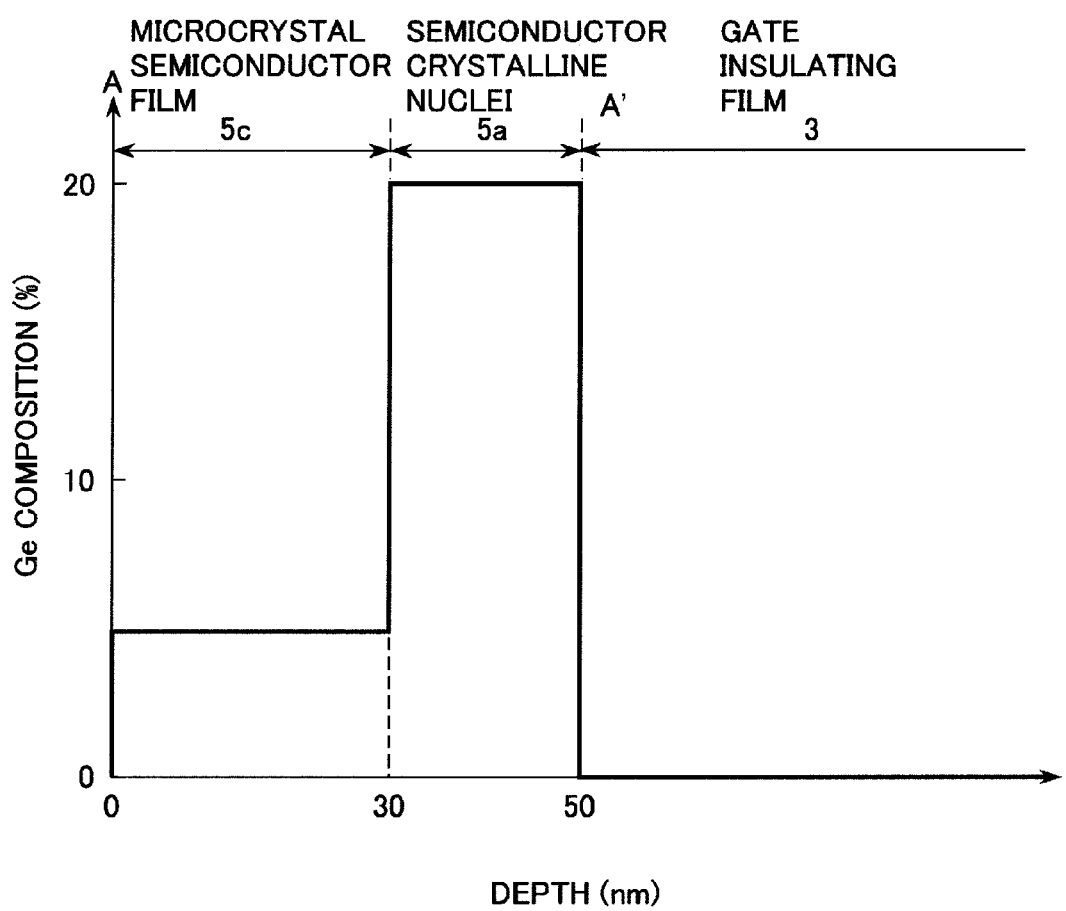
FIG. 11 is a graph showing germanium composition in the depth direction of the semiconductor film on a gate insulating film.
Figure 12:
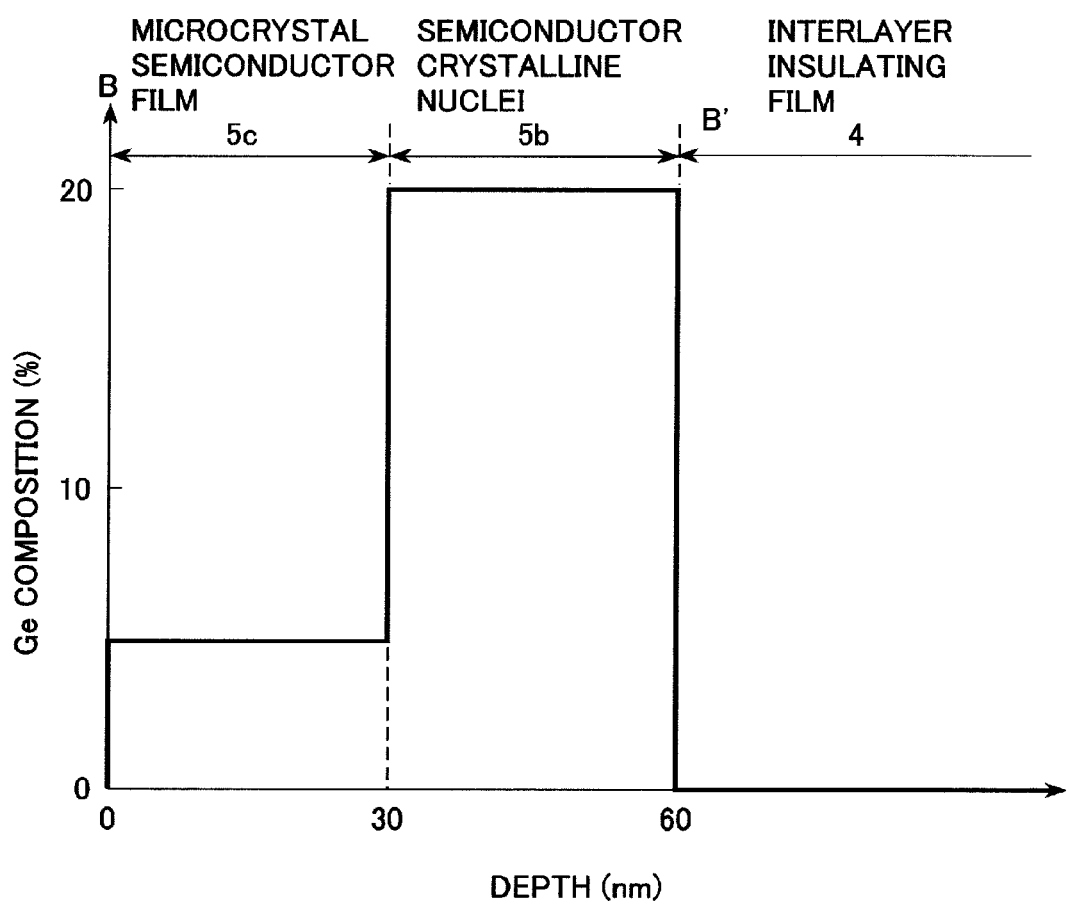
FIG. 12 is a graph showing germanium composition in the depth direction of the semiconductor film on an interlayer insulating film.

The Ge composition profile in the semiconductor crystalline nuclei 5a and 5b and the semiconductor film 5c having such a configuration is shown in FIGS. 11 and 12. FIG. 11 is a graph showing the Ge composition (%) along the line A-A' shown in FIG. 1B, of the semiconductor crystalline nuclei 5a and the semiconductor film 5c on the gate insulating film 3. In the graph, the horizontal axis represents the depth (nm) of the semiconductor crystalline nuclei 5a and the semiconductor film 5c. On the other hand, FIG. 12 is a graph showing the Ge composition (%) along the line B-B' shown in FIG. 1B, of the semiconductor crystalline nuclei 5b and the semiconductor film 5c on the interlayer insulating film 4. In the graph, the horizontal axis represents the depth (nm) of the semiconductor crystalline nuclei 5b and the semiconductor film 5c. In any of FIGS. 11 and 12, the Ge composition is 20% in the semiconductor crystalline nuclei 5a and 5b and 5% in the microcrystalline semiconductor film 5c, and is lower in the microcrystalline semiconductor film 5c than in the semiconductor crystalline nuclei 5a and 5b. Further, from the comparison between FIGS. 11 and 12, it can be understood that the size of the semiconductor crystalline nuclei on the interlayer insulating film 4 is larger than on the gate insulating film 3, and it is clear that the film thickness of the entire semiconductor film 5 increases.

In the semiconductor film 5c, it is desirable that hydrogen is contained in the concentration range of $5\times10^{19}$ cm$^{-3}$ to $1\times10^{22}$ cm$^{-3}$ in order to perform hydrogen termination of crystal defects in the film. This can be carried out after the semiconductor film 5c is formed by subjecting the semiconductor film to a treatment such as a hydrogen annealing treatment in a furnace, a treatment using atomic hydrogen which is generated by blowing hydrogen gas to a metal filament, or a treatment using hydrogen radicals which are generated using plasma. By doing so, it is possible to use the hydrogenated semiconductor film 5c as the channel layer of a thin film transistor, improve field-effect mobility, decrease the threshold voltage, and improve the sub-threshold swing in the transfer characteristics.

Figure 7:
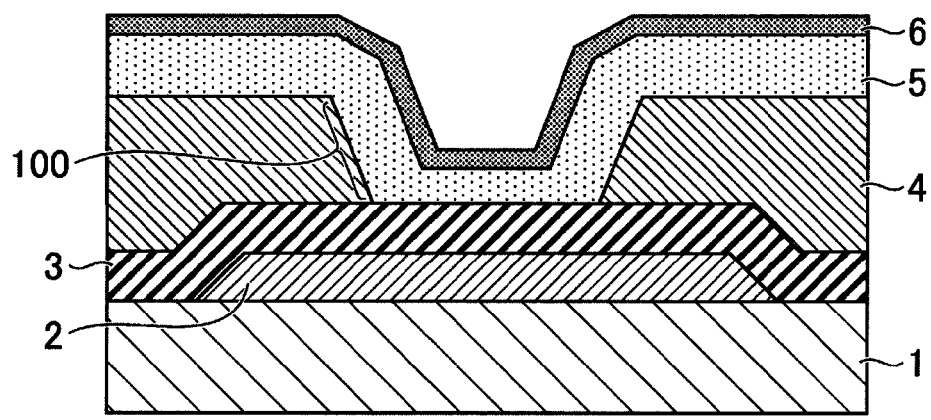
FIG. 7 is a view showing one embodiment of a method of manufacturing the thin film transistor shown in FIG. 1A, showing a series of manufacturing processes together with FIGS. 2 to 6 and FIGS. 8 and 9.

Process 6 (FIG. 7)

A high-concentration semiconductor film 6 is formed on an upper surface of the semiconductor film 5. The high-concentration semiconductor film 6 is configured to function as the contact layers 6a which is formed at the interface between the semiconductor film 5 and the drain electrodes 7a described later. Further, the high-concentration semiconductor film 6 is configured to function as the contact layers 6b which is formed at the interface between the semiconductor film 5 and the source electrodes 7b described later.

As the high-concentration semiconductor film 6, a high-concentration n-type amorphous silicon film which is deposited by a plasma CVD method, for example, is used. The deposition conditions may include, for example, plasma frequency: 13.56 MHz, hydrogen-diluted 10%-SiH$_4$ flow rate: 100 sccm, substrate temperature: 200° C., and gas pressure: 133 Pa, and phosphine (PH$_3$) or hydrogen-diluted gas (PH$_3$/H$_2$) thereof may be supplied as n-type doping gas. The doping concentration is preferably set to $1\times10^{17}$ cm$^{-3}$ or higher in order to form a low-resistance contact layer and $1\times10^{22}$ cm$^{-3}$ or lower in order to suppress degradation of crystallinity and an increase of resistance due to clustering or segregation of dopant atoms. The thickness of the high-concentration semiconductor film 6 is preferably set to 20 nm or larger, for example, in order to obtain a contact performance.

Figure 8:
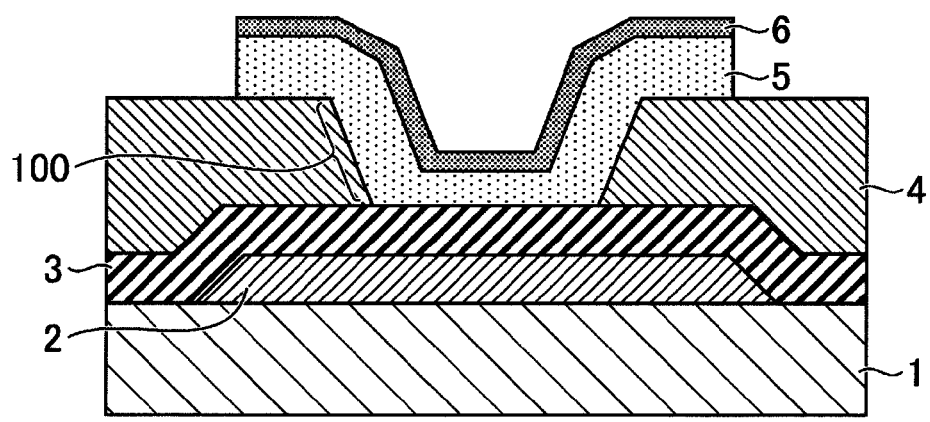
FIG. 8 is a view showing one embodiment of a method of manufacturing the thin film transistor shown in FIG. 1A, showing a series of manufacturing processes together with FIGS. 2 to 7 and FIG. 9.

Process 7 (FIG. 8)

The sequential laminated body of the semiconductor film 5 and the high-concentration semiconductor film 6 is dry-etched by a photolithography technique so as to remove portions of the laminated body so that a portion covering the opening OP of the interlayer insulating film 4 and a portion on the interlayer insulating film 4 around the opening OP are not removed.

Figure 9:
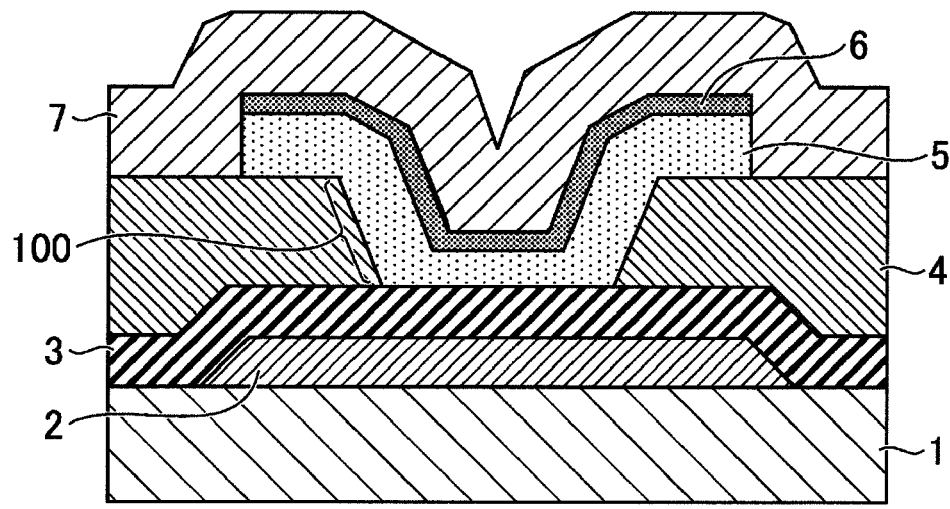
FIG. 9 is a view showing one embodiment of a method of manufacturing the thin film transistor shown in FIG. 1A, showing a series of manufacturing processes together with FIGS. 2 to 8.

Process 8 (FIG. 9)

A metal film 7 which forms the drain and source electrodes 7a and 7b is formed on the surface of the substrate. As for the material of the metal film 7, metals such as Nb, Mo, W, Ta, Cr, Ti, Fe, Ni, or Co, alloys thereof, and lamination films thereof can be used. Moreover, since the upper-limit process temperature can decrease, low-resistance metals such as Al or Cu can be used. In the forming of the metal film 7, a sputtering method can be used, for example. The film thickness is set to, for example, about 50 nm in order to decrease a resistance of metal line.

After that, as shown in FIG. 1A, dry-etching is carried out by a photolithography technique, whereby the drain and source electrodes 7a and 7b are formed from the metal film 7.

In this case, the high-concentration semiconductor film 6 exposed from the drain and source electrodes 7a and 7b is removed, and the semiconductor film 5 under the high-concentration semiconductor film 6 is also partially etched. This is to electrically isolate the drain and source electrodes 7a and 7b from each other.

In the etching of the semiconductor film 5, the etching rate on the sidewall surface of the recess portion reflecting the shape of the opening OP of the interlayer insulating film 4 is generally higher than the etching rate on the bottom surface. However, in the case of the present embodiment, since the thickness of the semiconductor film 5 on the sidewall surface is larger than the thickness of the semiconductor film 5 on the bottom surface, even after etching of this process is performed, and the thickness of the semiconductor film 5 decreases on the sidewall surface, a necessary film thickness can be secured.

Embodiment 2

Figure 13:
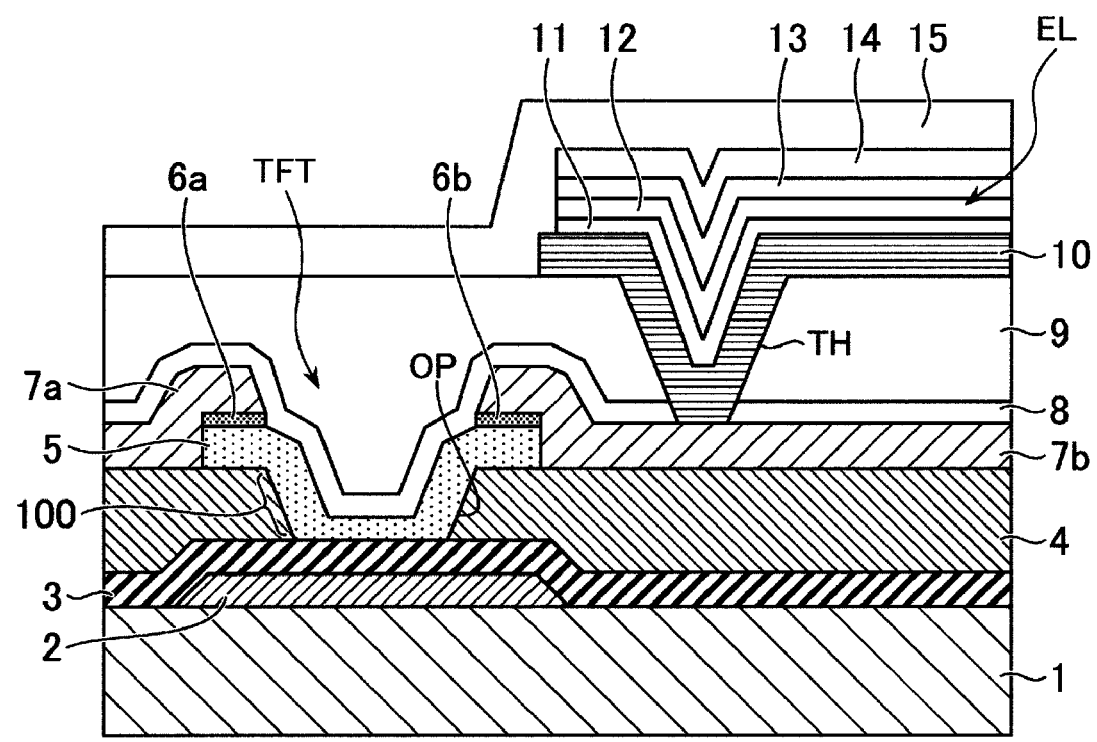
FIG. 13 is a sectional view showing a thin film transistor of an organic EL display device.

FIG. 13 is a sectional view in which the present invention is applied to an organic EL display device. In FIG. 13, an organic EL element EL formed on the insulation substrate 1 and a thin film transistor TFT electrically connected to the organic EL element EL are shown. The thin film transistor TFT has the same configuration as the thin film transistor shown in FIG. 1A. That is, the thin film transistor TFT is a bottom gate-type thin film transistor in which the semiconductor film 5 has the offset region 100 in the vertical direction to the plane of the insulation substrate 1. Moreover, the thickness of the semiconductor film 5 formed on the sidewall surface of the opening OP of the interlayer insulating film 4 is larger than the thickness of the semiconductor film 5 on the gate insulating film 3. A protective insulating film 8 and an interlayer insulating film 9 are sequentially formed so as to cover the thin film transistor TFT having such a configuration. The protective insulating film 8 is formed, for example, of a silicon nitride film and is formed, for example, by a plasma CVD method. The thickness of the protective insulating film 8 is 500 nm, for example. The interlayer insulating film 9 is formed of a resin film which is formed by coating, for example, and the surface thereof is planarized. The sequential laminated body of the protective insulating film 8 and the interlayer insulating film 9 has a through-hole TH through which a part of the source electrode 7b of the thin film transistor TFT is exposed, and a pixel electrode 10 formed on the upper surface of the interlayer insulating film 9 is electrically connected to the source electrode 7b through the through-hole TH. As for the pixel electrode 10, an aluminium (Al) film which has a thickness of about 100 nm and is formed, for example, by sputtering is used. A charge transport layer 11, a light-emitting layer 12, and a charge transport layer 13 are formed on the upper surface of the pixel electrode 10 by an evaporation method or the like, and an upper electrode 14 is formed so as to cover the charge transport layer 13. The upper electrode 14 is formed, for example, of a transparent conductive film, and light from the light-emitting layer 12 can pass through the upper electrode 14 and be irradiated in the upward direction of the drawing. Moreover, a sealing film 15 is formed on the upper surface of the substrate so as to cover the upper electrode 14. The pixel electrode 10 and the upper electrode 14 are not limited to the above-mentioned material, and the pixel electrode 10 may be formed of a transparent conductive film and the upper electrode 14 may be formed from Al or the like. In this case, light from the light-emitting layer 12 can pass through the pixel electrode 10 and be irradiated in the downward direction of the drawing.

Embodiment 3

Figure 14:
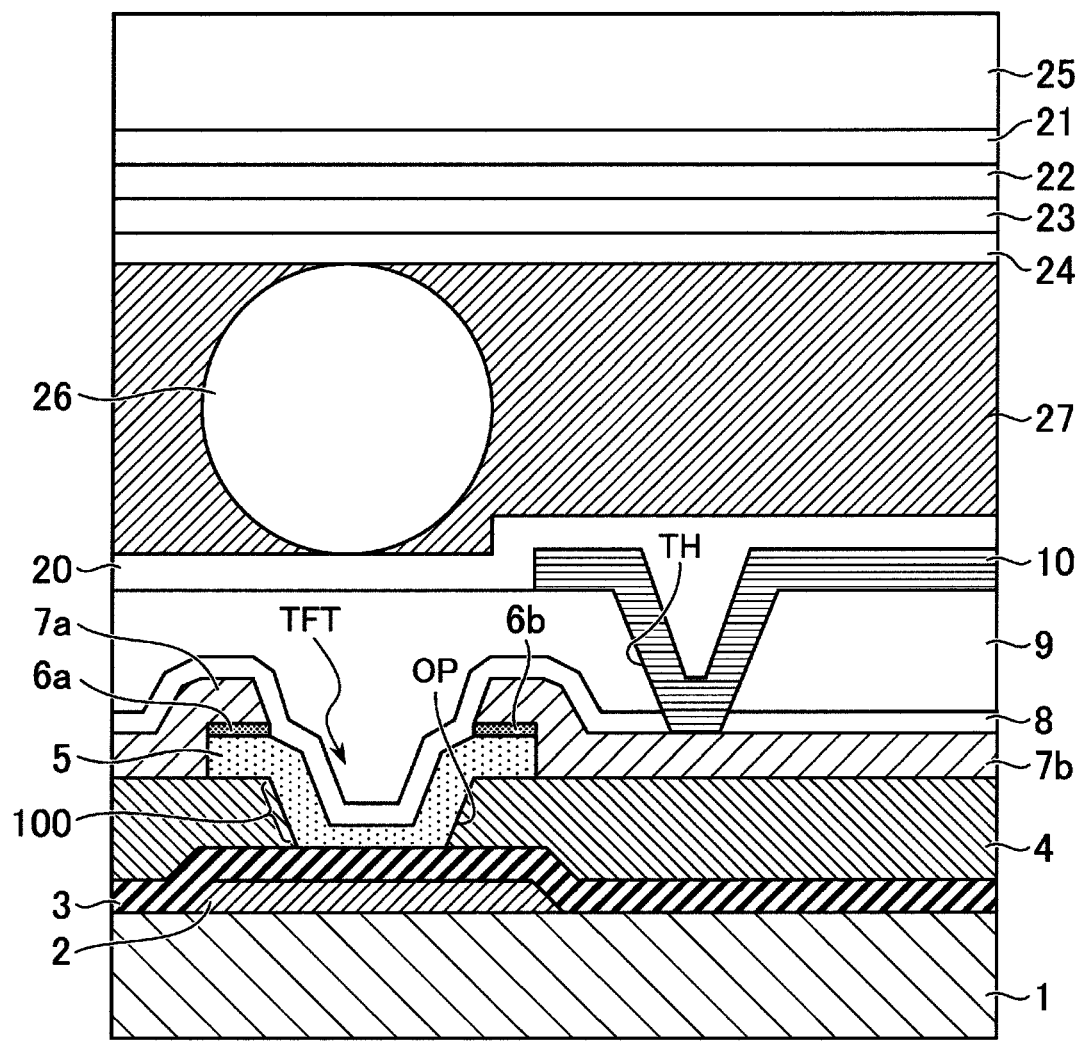
FIG. 14 is a sectional view showing a thin film transistor of a liquid crystal display device.

FIG. 14 is a sectional view in which the present invention is applied to a liquid crystal display device. Referring to FIG. 14, the first insulation substrate 1 and a second insulation substrate 25 are disposed with liquid crystals 27 disposed therebetween, and the pixel electrode 10 and a thin film transistor TFT electrically connected to the pixel electrode 10 are formed on a surface of the first insulation substrate 1 disposed close to the liquid crystals 27. The thin film transistor TFT has the same configuration as the thin film transistor shown in FIG. 1A. That is, the thin film transistor TFT is a bottom gate-type thin film transistor in which the semiconductor film 5 has the offset region 100 in the vertical direction to the plane of the first insulation substrate 1. Moreover, the thickness of the semiconductor film 5 formed on the sidewall surface of the opening OP of the interlayer insulating film 4 is larger than the thickness of the semiconductor film 5 on a gate insulating film. The protective insulating film 8 and the interlayer insulating film 9 are sequentially formed so as to cover the thin film transistor TFT having such a configuration. The protective insulating film 8 is formed, for example, of a silicon nitride film and is formed, for example, by a plasma CVD method. The thickness of the protective insulating film 8 is 500 nm, for example. The interlayer insulating film 9 is formed of a resin film which is formed by coating, for example, and the surface thereof is planarized. The sequential laminated body of the protective insulating film 8 and the interlayer insulating film 9 has the through-hole TH through which a part of the source electrode 7b of the thin film transistor TFT is exposed, and the pixel electrode 10 formed on the upper surface of the interlayer insulating film 9 is electrically connected to the source electrode 7b through the through-hole TH. The pixel electrode 10 is formed of a transparent conductive film. A first alignment film 20 is formed on the surface of the first substrate 1 disposed close to the liquid crystals. On the surface of the second substrate 25 disposed close to the liquid crystals, a color filter layer 21, an overcoat layer 22, an opposing electrode 23 formed of a transparent conductive film, and a second alignment film 24 are formed. The gap between the first insulation substrate 1 and the second insulation substrate 25 is held by a spacer 26, whereby the thickness of the liquid crystal layer is made uniform.

Embodiment 4

Figure 15:
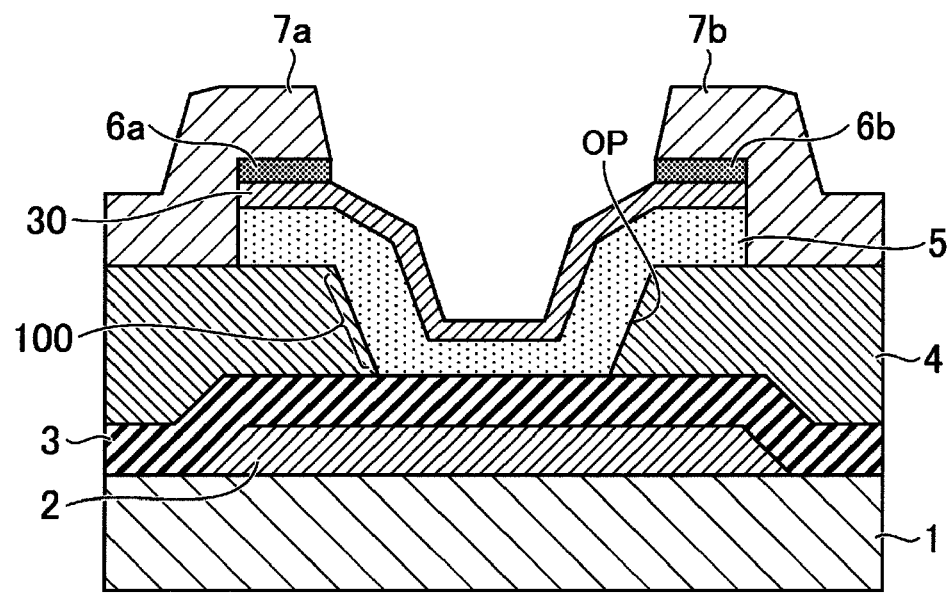
FIG. 15 is a sectional view showing another embodiment of the thin film transistor of the present invention.

FIG. 15 is a diagram showing Embodiment 4 of the present invention, in which a structure corresponding to FIG. 1A is illustrated. The configuration shown in FIG. 15 is different from that shown in FIG. 1A in that a semiconductor film of the thin film transistor is formed by a sequential laminated body of the semiconductor film 5 and a semiconductor film 30 which is made from hydrogen-containing amorphous silicon and formed on the upper surface of the semiconductor film 5. Therefore, the contact layer 6a formed at the interface between the drain electrode 7a and a semiconductor film and the contact layer 6b formed at the interface between the source electrode 7b and a semiconductor film are formed between the drain electrode 7a and the semiconductor film 30 and between the source electrode 7b and the semiconductor film 30. The semiconductor film 30 is formed, for example, by a plasma CVD method. At that time, as for the deposition temperature, a room temperature or higher can be used. However, in order to improve the manufacturing throughput of a thin film transistor, it is necessary to ensure a certain deposition temperature or higher. Thus, the deposition temperature is preferably set to 200° C. or higher. Moreover, in order to suppress elimination of hydrogen as much as possible, the deposition temperature of hydrogen is preferably set to 500° C. or lower.

The thickness of the semiconductor film 30 including the thickness of the semiconductor film 5 is preferably adjusted so as to be 30 nm to 300 nm. This is to prevent the laminated body of the semiconductor film 5 and the semiconductor film 30 from becoming too thin to maintain the characteristics of a thin film transistor which may be changed through dry-etching which is performed when forming the drain electrode 7a and source electrode 7b of the thin film transistor. Moreover, the thickness of the laminated body is preferably set to 300 nm or smaller in order to prevent an increase of takt time accompanied by an increase of the deposition time and a formation of a back channel on the surface side of the thin film transistor. In order to promote hydrogen termination of crystal defects formed in the semiconductor film 5, it is desirable that the concentration of hydrogen contained in the semiconductor film 30 is equal to or larger than $5 \times 10^{19}$ cm$^{-3}$ and equal to or smaller than $1 \times 10^{22}$ cm$^{-3}$. When the semiconductor film 30 formed of a hydrogenated amorphous silicon film is deposited, the deposition conditions may be set, for example, as follows: plasma frequency: 13.56 MHz, hydrogen-diluted 10%-silane (SiH$_4$) flow rate: 100 sccm, substrate temperature: 200° C., and gas pressure: 133 Pa. Moreover, since the crystallized semiconductor film 5 is used as an underlying layer, a microcrystalline silicon film, for example may be formed as the semiconductor film 30 in the following manner. The microcrystalline silicon film can be deposited under the deposition conditions, for example, including plasma frequency: 13.56 MHz, silicon tetrafluoride (SiF$_4$) flow rate:H$_2$ flow rate=3:1, substrate temperature: 250° C., and gas pressure: 40 Pa According to the embodiment shown in FIG. 15, since the hydrogenated semiconductor film 30 is used as the channel layer of the thin film transistor TFT, it is possible to further improve field-effect mobility, decrease the threshold voltage, and improve the sub-threshold swing in the transfer characteristics as compared to the thin film transistor TFT shown in Embodiment 1.

Embodiment 5

Figure 16:
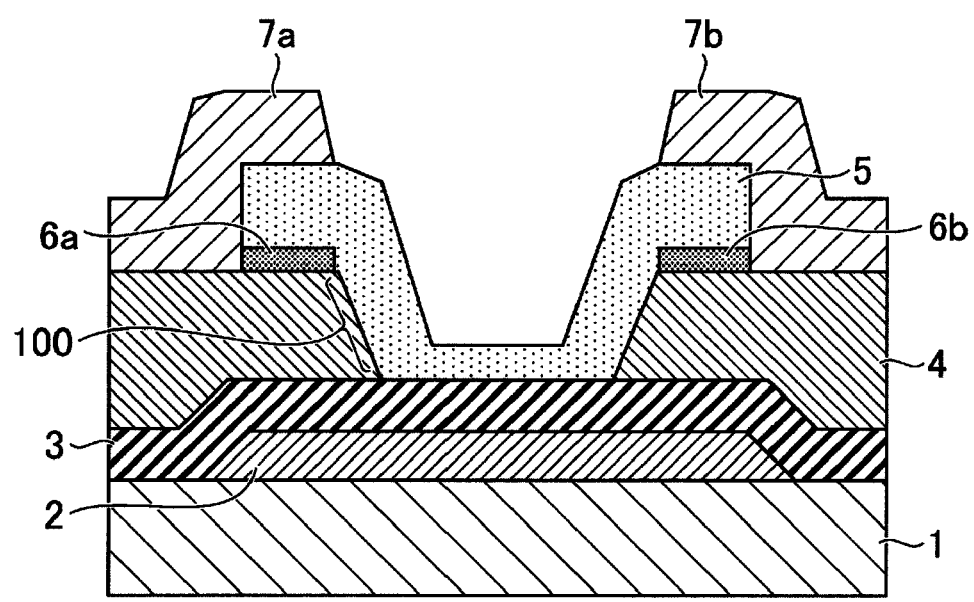
FIG. 16 is a sectional view showing another embodiment of the thin film transistor of the present invention.

FIG. 16 is a sectional view showing another embodiment of the thin film transistor TFT according to the present invention, in which a structure corresponding to FIG. 1A is illustrated.

The configuration shown in FIG. 16 is different from that shown in FIG. 1A in that the contact layer 6a which is formed of a high-concentration semiconductor film so as to electrically connect the semiconductor film 5 and the drain electrode 7a and the contact layer 6b which is formed of a high-concentration semiconductor film so as to electrically connect the semiconductor film 5 and the source electrode 7b are formed at the interface between the interlayer insulating film 4 and the semiconductor film 5. A part of the sidewall surface of each of the contact layers 6a and 6b is formed so as to be even with the sidewall surface of the semiconductor film 5. The drain electrode 7a is formed so as to extend from the upper surface of the semiconductor film 5 to the sidewall surface and is electrically connected to the sidewall surface of the contact layer 6a. The source electrode 7b is formed so as to extend from the upper surface of the semiconductor film 5 to the sidewall surface and is electrically connected to the sidewall surface of the contact layer 6b.

In the thin film transistor TFT having such a configuration, the crystal grain size of the semiconductor film 5 on the contact layers 6a and 6b is increased, and phosphorus is included in the semiconductor film 5. Therefore, the contact properties of the drain and source electrodes 7a and 7b are improved. Accordingly, it is possible to further improve field-effect mobility as compared to the thin film transistor TFT shown in Embodiment 1.

[Manufacturing Method]

FIGS. 17 to 21 are diagrams showing the processes of a method of manufacturing the thin film transistor shown in FIG. 16. Hereinafter, the manufacturing method will be described in the order of the processes.

Figure 17:
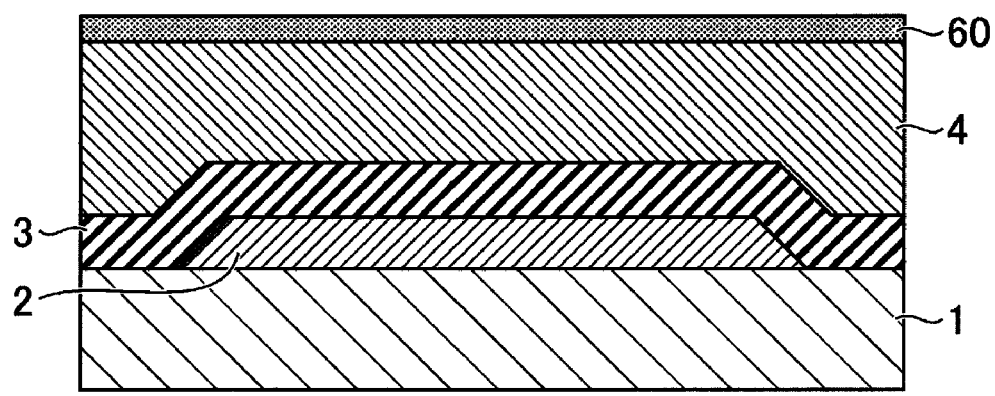
FIG. 17 is a view showing one embodiment of a method of manufacturing the thin film transistor shown in FIG. 16, showing a series of manufacturing processes together with FIGS. 18 to 21.

Process 1 (FIG. 17)

First, the insulation substrate 1 is prepared, and the gate electrode 2, the gate insulating film 3, the interlayer insulating film 4, and a high-concentration semiconductor film 60 are formed on the surface of the insulation substrate 1.

Figure 18:
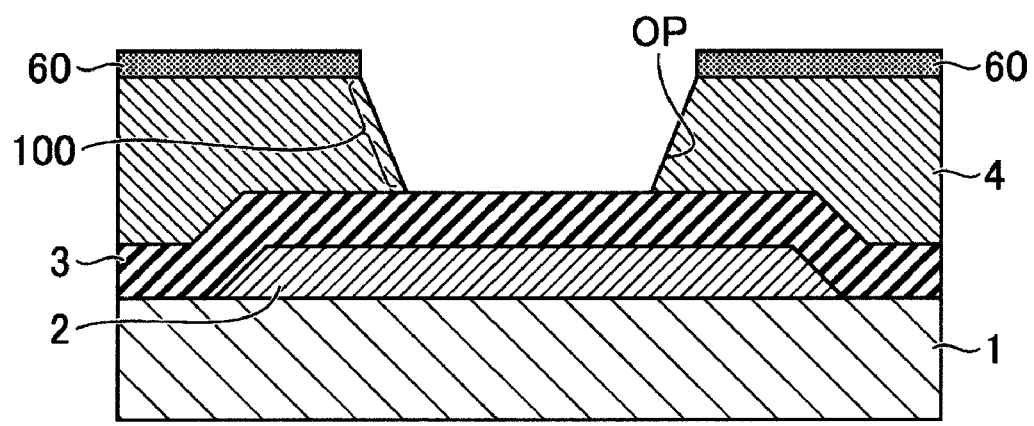
FIG. 18 is a view showing one embodiment of a method of manufacturing the thin film transistor shown in FIG. 16, showing a series of manufacturing processes together with FIG. 17 and FIGS. 19 to 21.

Process 2 (FIG. 18)

The opening OP is formed on the high-concentration semiconductor film 60 and the interlayer insulating film 4 in a formation region of the gate electrode 2 in top view. The opening of the high-concentration semiconductor film 60 and the interlayer insulating film 4 is carried out by etching which uses a photolithography technique. Dry-etching is preferred for the high-concentration semiconductor film 60 and wet-etching is preferred for the interlayer insulating film 4.

Figure 19:
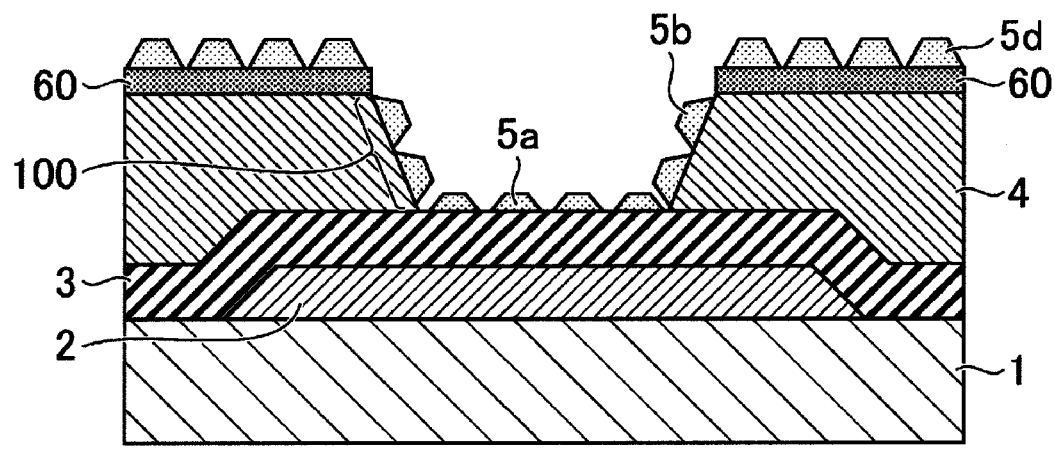
FIG. 19 is a view showing one embodiment of a method of manufacturing the thin film transistor shown in FIG. 16, showing a series of manufacturing processes together with FIGS. 17 and 18 and FIGS. 20 and 21.

Process 3 (FIG. 19)

Figure 22:
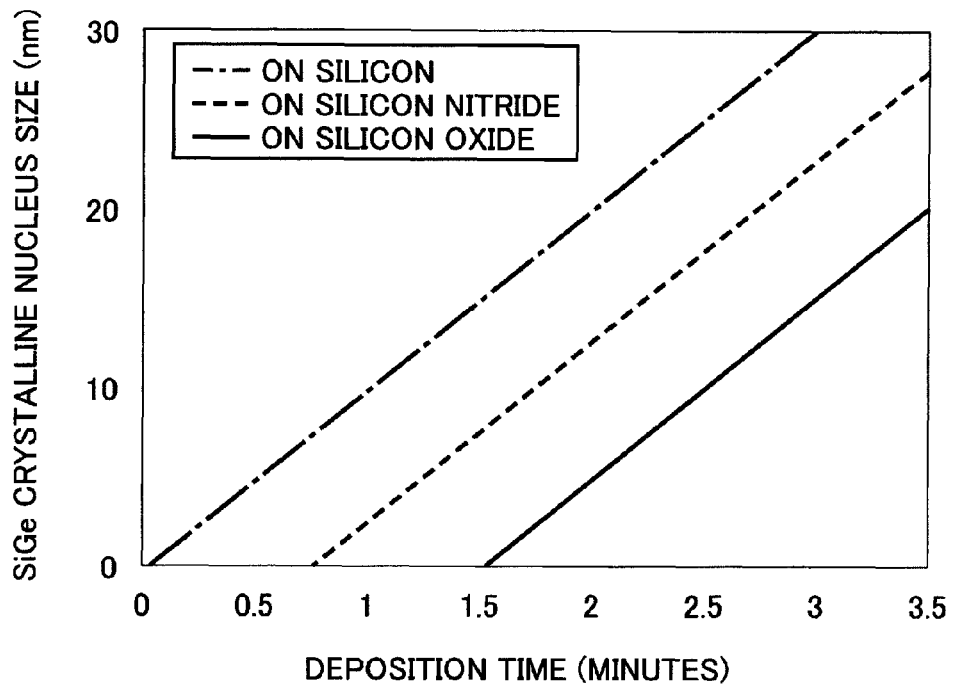
FIG. 22 is a graph showing the size of SiGe crystalline nuclei and a different starting time of the deposition of a semiconductor film on silicon nitride, silicon oxide, and silicon.

Semiconductor crystalline nuclei 5d, 5b, and 5a are formed on the surface of the high-concentration semiconductor film 60, the sidewall surface of the opening OP of the interlayer insulating film 4, and the surface of the gate insulating film 3 exposed through the opening OP of the interlayer insulating film 4, respectively. Here, the semiconductor crystalline nuclei 5d on the high-concentration semiconductor film 60 have a larger nucleus size than the semiconductor crystalline nuclei 5b on the sidewall surface of the opening OP of the interlayer insulating film 4. FIG. 22 is a graph corresponding to FIG. 10, showing the relationship between the size of the SiGe crystalline nuclei formed on the semiconductor film and the deposition time in the graph shown in FIG. 10. From this graph, it can be understood that the grain size of the semiconductor crystalline nuclei 5d on the high-concentration semiconductor film 60 is larger than that of the semiconductor crystalline nuclei 5b on the sidewall surface of the opening OP of the interlayer insulating film 4. Similarly to Embodiment 1, the grain size of the semiconductor crystalline nuclei 5b on the sidewall surface of the opening OP of the interlayer insulating film 4 is larger than the grain size of the semiconductor crystalline nuclei 5a on the gate insulating film 3.

Figure 20:
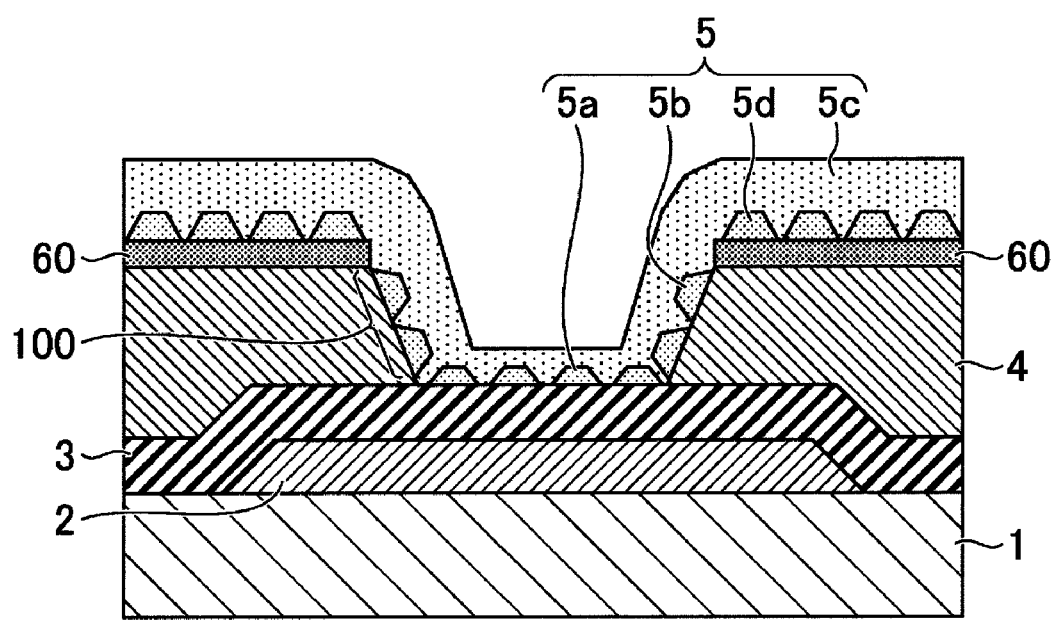
FIG. 20 is a view showing one embodiment of a method of manufacturing the thin film transistor shown in FIG. 16, showing a series of manufacturing processes together with FIGS. 17 to 19 and FIG. 21.

Process 4 (FIG. 20)

Subsequently, the microcrystalline semiconductor film 5c is formed. The semiconductor film 5c is formed by carrying out crystal growth using the semiconductor crystalline nuclei 5a, 5b, and 5d as seeds. The deposition method and conditions of the semiconductor film 5c are the same as in the case of forming the corresponding portion of Embodiment 1. The thickness of the semiconductor film 5c on the high-concentration semiconductor film 60 is larger than on the interlayer insulating film 4. This is because n-type impurities (for example, phosphorus) are diffused from the underlying high-concentration semiconductor film 60 during the deposition of the semiconductor film 5c, and this diffusion accelerates the growth of crystal grains.

Figure 21:
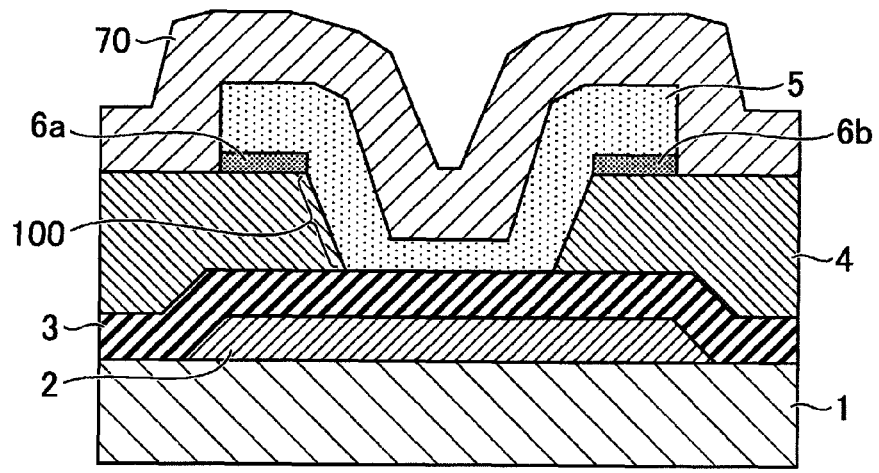
FIG. 21 is a view showing one embodiment of a method of manufacturing the thin film transistor shown in FIG. 16, showing a series of manufacturing processes together with FIGS. 17 to 20.

Process 5 (FIG. 21)

The semiconductor film 5 and the high-concentration semiconductor film 60 are dry-etched by a photolithography technique so as to remove portions of the films so that the opening OP and a portion around the opening OP are not removed. The high-concentration semiconductor film 60 disposed between the semiconductor film 5 and the interlayer insulating film 4 on the left side in the drawing with respect to the opening OP is formed as the contact layer 6a, and the high-concentration semiconductor film 60 disposed between the semiconductor film 5 and the interlayer insulating film 4 on the right side in the drawing with respect to the opening OP is formed as the contact layer 6b.

After that, a metal film 70 is formed on the surface of the substrate and is patterned, whereby the drain electrode 7a and the source electrode 7b are formed as shown in FIG. 16.

In this case, the surface of the semiconductor film 5 is also partially etched by the etching at the formation time of the drain and source electrodes 7a and 7b. Moreover, the etching rate on the tapered sidewall surface of the opening OP is higher than that on the bottom surface thereof. However, in the present embodiment, the same deposition characteristics shown in FIG. 10 are used, and the thickness of the semiconductor film 5 is larger on the interlayer insulating film 4 made from silicon nitride, for example, than on the gate insulating film 3 made from silicon oxide, for example. That is, the thickness of the semiconductor film 5 is larger on the sidewall surface of the opening OP than on the bottom surface of the opening OP. Therefore, even after dry-etching of this process is performed, the semiconductor film 5 can ensure a necessary film thickness on the opening OP.

Embodiment 6

Figure 23:
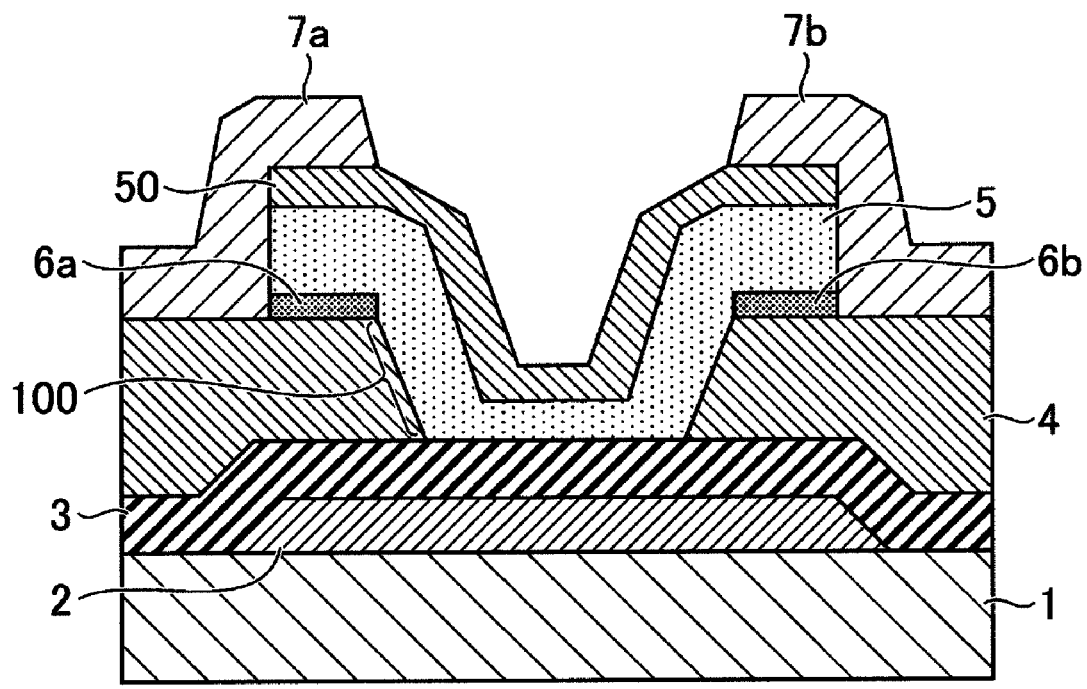
FIG. 23 is a sectional view showing another embodiment of the thin film transistor of the present invention.

FIG. 23 is a sectional view showing another embodiment of the thin film transistor according to the present invention, in which a structure corresponding to FIG. 16 is illustrated.

The configuration shown in FIG. 23 is different from that shown in FIG. 16 in that a semiconductor film of the thin film transistor is formed by a sequential laminated body of the semiconductor film 5 and a semiconductor film 50 which is made from hydrogen-containing amorphous silicon, for example. The drain and source electrodes 7a and 7b are formed to be in contact with the upper surface of the semiconductor film 50.

According to the thin film transistor having such a configuration, the hydrogenated semiconductor film 50 is used as the channel layer of the thin film transistor. Therefore, it is possible to further improve field-effect mobility, decrease the threshold voltage, and improve the sub-threshold swing in the transfer characteristics as compared to the thin film transistor shown in FIG. 16, for example.

Embodiment 7

Figure 24:
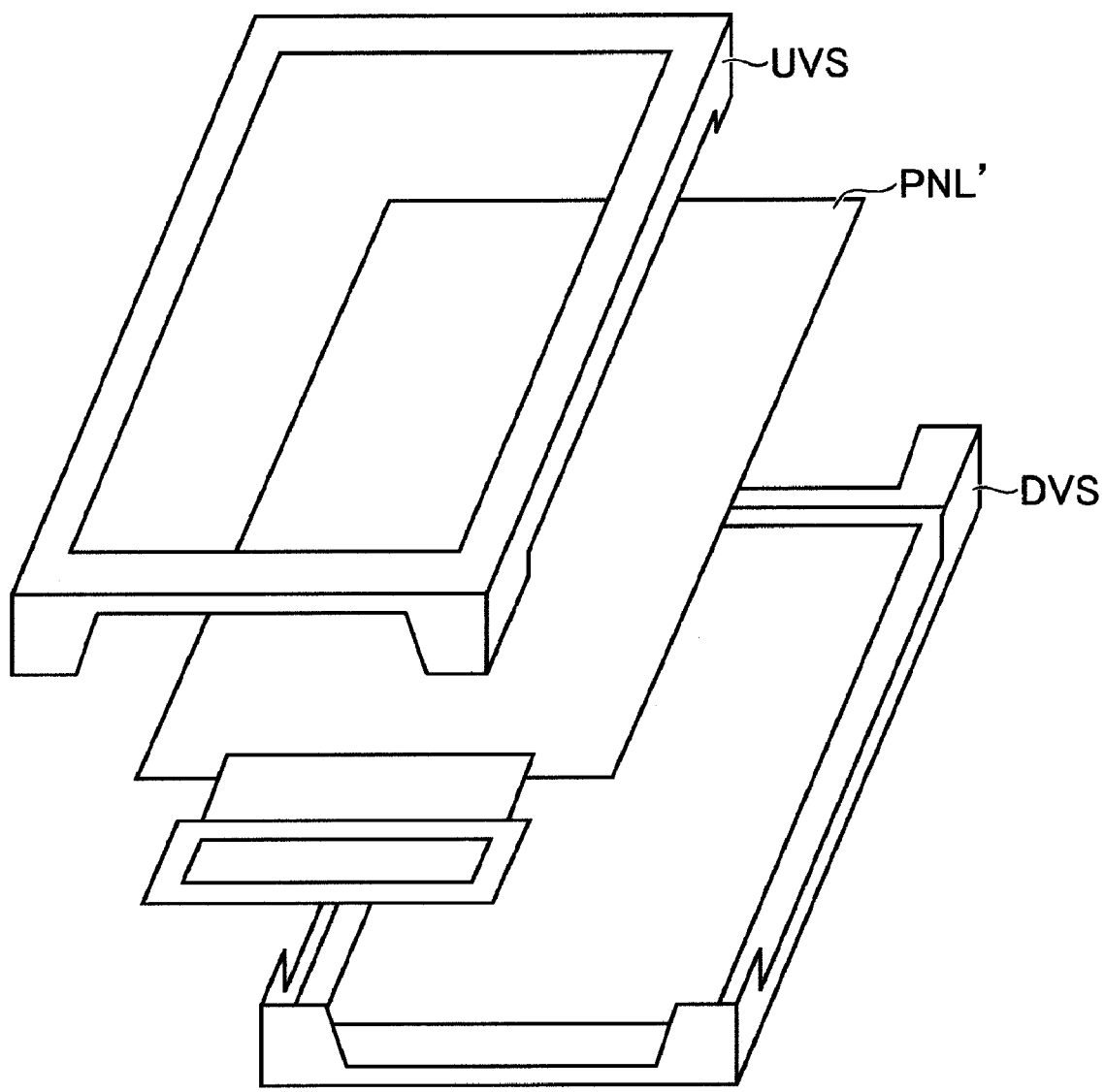
FIG. 24 is a schematic appearance diagram of an organic EL display device having the thin film transistor of the present invention.

FIG. 24 is an exploded perspective view showing an example of an organic EL display device to which the present invention is applied. Referring to FIG. 24, an organic EL display panel PNL' is shown, and in a display portion of the panel, a thin film transistor (not shown) according to the present invention is provided in each of pixels which are arranged in a matrix form. The thin film transistor functions as a switching element for pixel selection. Moreover, a circuit for driving the respective pixels is formed around the display portion, and the thin film transistor according to the present invention can be provided in the circuit. An upper frame UVS and a lower frame DVS are disposed on the front and rear surfaces of the organic EL display panel PNL', respectively, and these upper and lower frames UVS and DVS are engaged with each other to form the frame of the organic EL display device.

Embodiment 8

Figure 25:
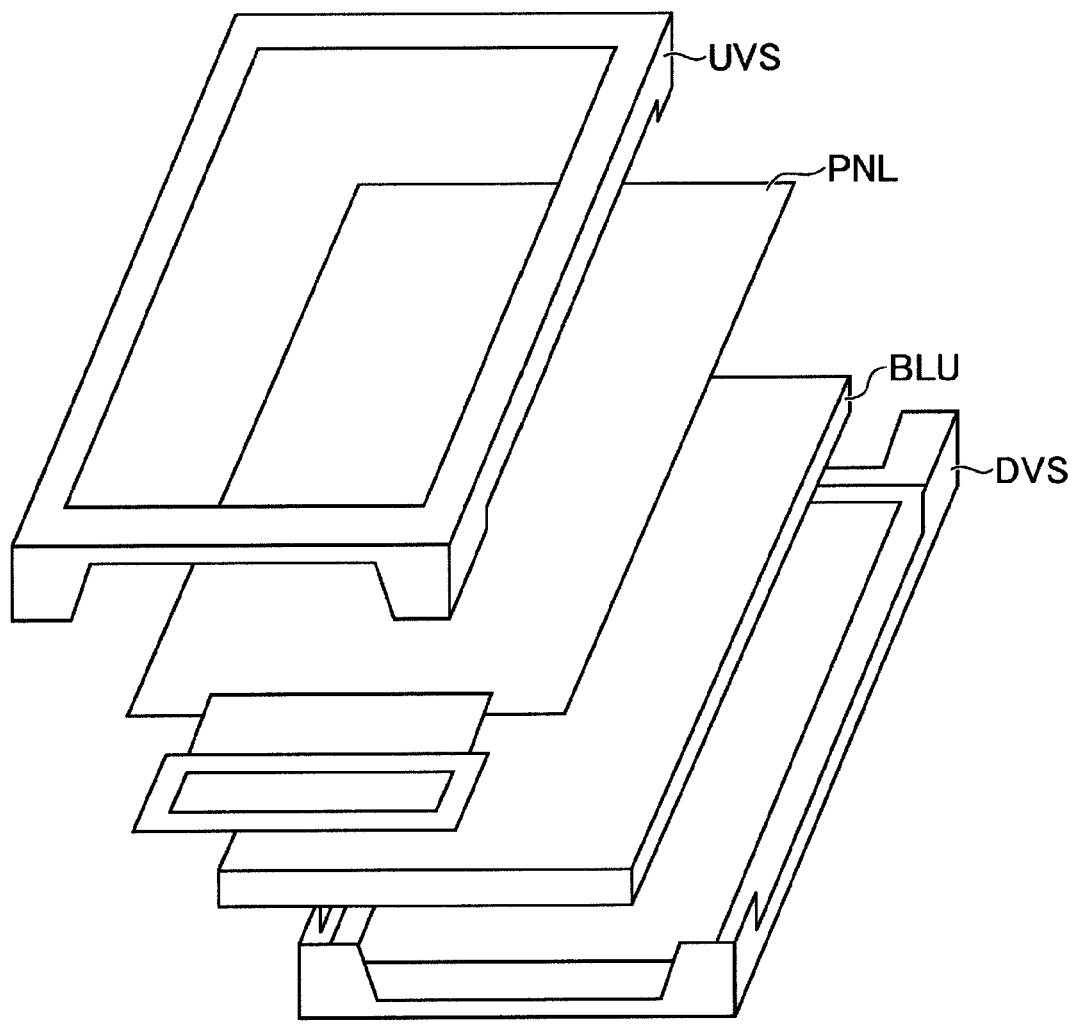
FIG. 25 is a schematic appearance diagram of a liquid crystal display device having the thin film transistor of the present invention.
Figure 26:
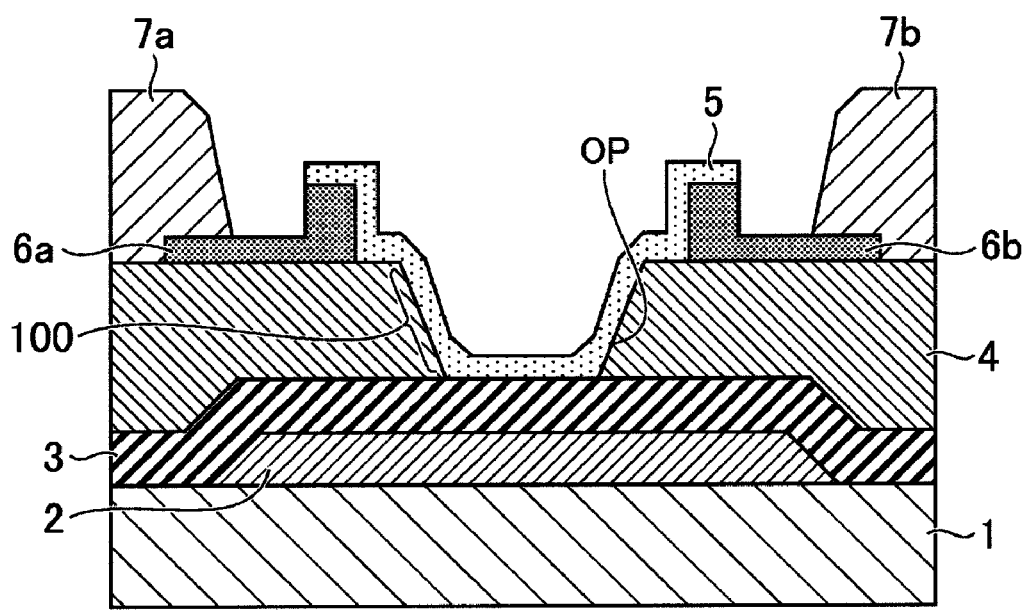
FIG. 26 is a diagram illustrating a problem of a thin film transistor according to the related art.

FIG. 25 is an exploded perspective view showing an example of a liquid crystal display device to which the present invention is applied. Referring to FIG. 25, a liquid crystal display panel PNL is shown, and in a display portion of the panel, a thin film transistor (not shown) according to the present invention is provided in each of pixels which are arranged in a matrix form. The thin film transistor functions as a switching element for pixel selection. Moreover, a circuit for driving the respective pixels is formed around the display portion, and the thin film transistor (not shown) according to the present invention can be provided in the circuit. A backlight BLU is disposed on the back surface of the liquid crystal display panel PNL. Since the pixels of the liquid crystal display panel PNL are configured to change transmittance of light rather than to emit light, the backlight BLU is needed. The upper frame UVS is disposed on the front side of the liquid crystal display panel PNL and the lower frame DVS is disposed on the rear side of the backlight BLU. These upper and lower frames UVS and DVS are engaged with each other to form the frame of the liquid crystal display device.

While the present invention has been described by way of embodiments, the configurations described in the respective embodiments are merely exemplary, and the present invention can be appropriately modified within a range without departing from the technical idea thereof. Moreover, the configurations described in the respective embodiments may be used in combination unless they contradict each other.

What is claimed is:

1. A thin film transistor comprising:
an insulation substrate;
a gate electrode formed on an upper surface of the insulation substrate;
a gate insulating film formed on the upper surface of the insulation substrate and an upper surface of the gate electrode;
an interlayer insulating film formed on an upper surface of the gate insulating film, having an opening which is formed in a formation region of the gate electrode in top view;
a semiconductor film formed on the interlayer insulating film around the opening so as to cover the opening; and
a drain electrode and a source electrode formed on the semiconductor film so as to face each other with the opening disposed therebetween, wherein the interlayer insulating film contains nitrides in an amount larger than that in the gate insulating film, and
wherein the semiconductor film includes a microcrystalline semiconductor film or a polycrystalline semiconductor film formed on semiconductor crystalline nuclei which are formed on the gate insulating film and the interlayer insulating film and contain at least Ge.

2. The thin film transistor according to claim 1,
wherein the gate insulating film is made from silicon oxide, and
wherein the interlayer insulating film is made from silicon nitride.

3. The thin film transistor according to claim 1,
wherein the semiconductor crystalline nuclei are made from SiGe or Ge, and
wherein the microcrystalline semiconductor film or the polycrystalline semiconductor film is made from SiGe or Si.

4. The thin film transistor according to claim 1, wherein the Ge composition of the semiconductor crystalline nuclei is larger than the Ge composition of the microcrystalline semiconductor film or the polycrystalline semiconductor film.

5. The thin film transistor according to claim 1,
wherein a contact layer in which high-concentration impurities are doped is formed in the semiconductor film at the interface between the drain electrode and the semiconductor film, and
wherein a contact layer in which high-concentration impurities are doped is formed in the semiconductor film at the interface between the source electrode and the semiconductor film.

6. The thin film transistor according to claim 1,
wherein a contact layer electrically connected to the drain electrode is formed by doping high-concentration impurities onto the semiconductor film at the interface between the semiconductor film and the interlayer insulating film, and
wherein a contact layer electrically connected to the source electrode is formed by doping high-concentration impurities onto the semiconductor film at the interface between the semiconductor film and the interlayer insulating film.

7. The thin film transistor according to claim 1, wherein the semiconductor film has a two-layered structure in which a hydrogen-containing amorphous semiconductor film is laminated on a surface opposite the gate insulating film.

* * * * *